(12) United States Patent
Han et al.

(10) Patent No.: US 8,742,473 B2
(45) Date of Patent: Jun. 3, 2014

(54) SEMICONDUCTOR DEVICES HAVING LIGHTLY DOPED CHANNEL IMPURITY REGIONS

(75) Inventors: Seung-Uk Han, Suwon-si (KR); Min-Chul Park, Hwaseong-si (KR); Young-Jin Choi, Hwaseong-si (KR); Nam-Ho Jeon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 218 days.

(21) Appl. No.: 13/277,433

(22) Filed: Oct. 20, 2011

(65) Prior Publication Data

US 2012/0098072 A1    Apr. 26, 2012

(30) Foreign Application Priority Data

Oct. 20, 2010    (KR) .................. 10-2010-0102586

(51) Int. Cl.
*H01L 29/66*    (2006.01)

(52) U.S. Cl.
USPC ................. 257/260; 257/E29.265; 438/542

(58) Field of Classification Search
None
See application file for complete search history.

(56) References Cited

U.S. PATENT DOCUMENTS

| | | | | |
|---|---|---|---|---|
| 5,675,166 A | * | 10/1997 | Ilderem et al. | 257/345 |
| 6,114,211 A | * | 9/2000 | Fulford et al. | 438/305 |
| 6,528,376 B1 | * | 3/2003 | Guo | 438/302 |
| 6,580,149 B2 | * | 6/2003 | Tran et al. | 257/549 |
| 2007/0159880 A1 | * | 7/2007 | Eitan | 365/184 |
| 2011/0156173 A1 | * | 6/2011 | Usujima | 257/402 |
| 2011/0169993 A1 | * | 7/2011 | Rhodes | 348/311 |
| 2011/0221000 A1 | * | 9/2011 | Shima | 257/344 |
| 2011/0248347 A1 | * | 10/2011 | Benaissa et al. | 257/368 |

FOREIGN PATENT DOCUMENTS

| | | |
|---|---|---|
| KR | 1020050028597 A | 3/2005 |
| KR | 1020050056399 A | 6/2005 |
| KR | 1020050108197 A | 11/2005 |

* cited by examiner

*Primary Examiner* — Sonya D McCall Shepard
(74) *Attorney, Agent, or Firm* — Myers Bigel Sibley & Sajovec

(57) ABSTRACT

Semiconductor devices are provided including a gate across an active region of a substrate; a source region and a drain region in the active region on either side of the gate and spaced apart from each other; a main channel impurity region in the active region between the source and drain regions and having a first channel impurity concentration; and a lightly doped channel impurity region in the active region adjacent to the drain region. The lightly doped channel impurity region has the same conductivity type as the main channel impurity region and a second channel impurity concentration, lower than the first channel impurity concentration. The lightly doped channel impurity region and the main channel impurity region contain a first element. The lightly doped channel impurity region also contains a second element, which is a different Group element from the first element.

20 Claims, 20 Drawing Sheets

SEMICONDUCTOR DEVICES HAVING LIGHTLY DOPED CHANNEL IMPURITY REGIONS

CLAIM OF PRIORITY

This application claims priority to Korean Patent Application No. 10-2010-0102586 filed Oct. 20, 2010, the disclosure of which is hereby incorporated herein by reference as if set forth in its entirety.

FIELD

The present inventive concept relates to semiconductor devices and, more particularly, to semiconductor devices having lightly doped channel impurity regions.

BACKGROUND

In general, as discrete devices such as transistors that make up semiconductor devices are reduced in size, the reliable electrical properties are required.

SUMMARY

In some embodiments of the present inventive concept, a semiconductor device including a lightly doped channel impurity region is provided. The device includes a gate disposed across an active region of a semiconductor substrate. A source region and a drain region are disposed in the active region on both sides of the gate and spaced apart from each other. A main channel impurity region is disposed in the active region between the source and drain regions and has a first channel impurity concentration. A lightly doped channel impurity region is disposed in the active region adjacent to the drain region. The lightly doped channel impurity region has the same conductivity type as the main channel impurity region and a second channel impurity concentration that is lower than the first channel impurity concentration. Both the lightly doped channel impurity region and the main channel impurity region contain a first element, which is one of Group III and V elements of the Mendeleev Periodic Table. The lightly doped channel impurity region contains a second element, which is a different Group element from the first element, and the second element is one of the Group III and V elements.

In further embodiments, the lightly doped channel impurity region may be spaced apart from the source region.

In still further embodiments, the lightly doped channel impurity region may be spaced apart from a top surface of the active region.

In some embodiments, the lightly doped channel impurity region may be disposed adjacent to the drain region and extend to a top surface of the active region.

In further embodiments, the semiconductor device may further include a halo region disposed in the active region adjacent to the source region, the halo region having the same conductivity type as the main channel impurity region, and a third channel impurity concentration that is higher than the first channel impurity concentration. The halo region and the lightly doped channel impurity region may be spaced apart from each other.

In still further embodiments, the semiconductor device may further include a first halo region and a second halo region. The first halo region may be disposed in the active region adjacent to the source region. The first halo region may have the same conductivity type as the main channel impurity region and a third channel impurity concentration that is higher than the first channel impurity concentration. The second halo region may be disposed in the active region adjacent to the drain region. The second halo region may have the same conductivity type as the main channel impurity region and a fourth channel impurity concentration that is higher than the first channel impurity concentration. The first and second halo regions may be spaced apart from each other, and the second halo region may be disposed adjacent to the lightly doped channel impurity region.

In some embodiments, a junction between the lightly doped channel impurity region and the drain region may be closer to the gate than a junction between the second halo region and the drain region.

In further embodiments, the drain region may include a first portion configured to form a first PN junction with the lightly doped channel impurity region, and a second portion configured to form a second PN junction with the main channel impurity region.

In still further embodiments, the main channel impurity region may have a first P-type impurity concentration and a first N-type impurity concentration, and the lightly doped channel impurity region may have the first P-type impurity concentration and a second N-type impurity concentration that is higher than the first N-type impurity concentration.

In some embodiments, the main channel impurity region and the lightly doped channel impurity region may have P-type conductivity, and a Group III atom may have a higher concentration than a Group V atom in the lightly doped channel impurity region.

In further embodiments, the drain region may have a shallower junction depth than the source region.

In still further embodiments, at least one of the source and drain regions may include a heavily doped region and a lightly doped channel impurity region configured to extend from the heavily doped region into the main channel impurity region disposed under the gate.

In some embodiments, the semiconductor device may further include a gate trench region disposed across the active region between the source and drain regions. The gate may be formed in the gate trench region, and the lightly doped channel impurity region may be formed under the drain region.

Further embodiments of the present inventive concept provide a semiconductor device including channel impurity regions with different channel impurity concentrations is provided. The device includes a gate electrode disposed across an active region of a semiconductor substrate. A gate dielectric material is interposed between the gate electrode and the active region. A source region and a drain region are disposed in the active region on both sides of the gate electrode and spaced apart from each other. A main channel impurity region is disposed in the active region between the source and drain regions. A lightly doped channel impurity region is disposed in the active region adjacent to the drain region. The lightly doped channel impurity region has the same conductivity type as the main channel impurity region and a channel impurity concentration that is lower than the main channel impurity region.

In still further embodiments, the main channel impurity region may have P-type conductivity including boron (B), and the lightly doped channel impurity region may have P-type conductivity including B and at least one of phosphorus (P) and arsenic (As).

In some embodiments, each of the main channel impurity region and the lightly doped channel impurity region may include both Group III and V elements, and the Group III element may have a higher concentration than the Group V element.

In further embodiments, the main channel impurity region may have a first width, and the lightly doped channel impurity region may have a second width that is less than the first width.

In still further embodiments, a semiconductor device capable of reducing or possibly preventing degradation of a transistor due to HCI is provided. The device includes a gate electrode disposed across an active region of a semiconductor substrate. A gate dielectric material is interposed between the gate electrode and the active region. A source region and a drain region are disposed in the active region on both sides of the gate electrode and spaced apart from each other. A main channel impurity region is disposed in the active region between the source and drain regions and has a first channel impurity concentration. A lightly doped channel impurity region is disposed in the active region adjacent to the drain region and has the same conductivity type as the main channel impurity region. A halo region is disposed in the active region adjacent to the source region and has the same conductivity type as the main channel impurity region. The main channel impurity region, the lightly doped channel impurity region, and the halo region contain a Group III element and have P-type conductivity. The halo region has a higher P-type impurity concentration than the main channel impurity region. The lightly doped channel impurity region contains Group III and V elements and has the P-type conductivity.

In some embodiments, the source region may include a first heavily doped region and a first lightly doped region configured to extend from the first heavily doped region into the main channel impurity region disposed under the gate electrode. The drain region may have a shallower junction depth than the source region.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
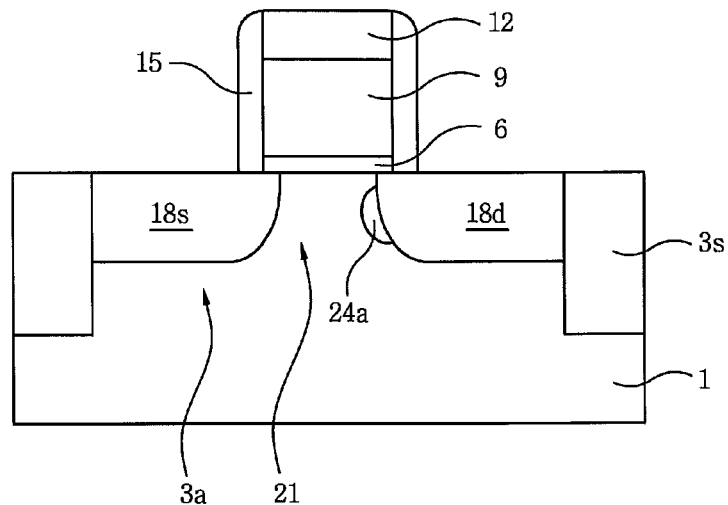
FIGS. 1 through 13 are cross-sections of semiconductor devices according to some embodiments of the inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the inventive concept. Accordingly, the exemplary views may be modified depending on manufacturing technologies and/or tolerances. Therefore, the embodiments of the inventive concept are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Referring first to FIG. 1, a cross-sectional view of a first metal-oxide-semiconductor (MOS) transistor T1 according to some embodiments of the inventive concept will be discussed. As illustrated in FIG. 1, a semiconductor substrate 1 may be provided. The semiconductor substrate 1 may be a semiconductor wafer formed of a semiconductor material, such as silicon (Si).

An isolation region 3s defining an active region 3a may be provided in the semiconductor substrate 1. The isolation region 3s may be a shallow trench isolation (STI) layer. The active region 3a may be N or P-type. For example, when an NMOS transistor is provided in the active region 3a, the active region 3a may be P-type containing a Group III element. Similarly, when a PMOS transistor is provided in the active region 3a, the active region 3a may be N-type containing a Group V element.

A gate 6 and 9 may be provided across the active region 3a. The gate 6 and 9 may include a gate dielectric material 6 and a gate electrode 9 that are stacked sequentially. The gate dielectric material 6 may include at least one of silicon oxide and a high-k dielectric material. Here, the high-k dielectric material may be, for example, a dielectric material having a higher dielectric constant than silicon oxide. For example, the high-k dielectric material may include hafnium oxide ($HfO_2$), aluminum oxide ($Al_2O_3$), titanium oxide ($TiO_2$), tantalum oxide ($Ta_2O_5$), or other high-k dielectric materials. The gate electrode 9 may include a conductive material. For example, the gate electrode 9 may include at least one selected from the group consisting of doped polysilicon (doped poly-Si), a metal silicide, and a metal. A gate mask 12 may be provided on the gate electrode 9. The gate mask 12 may include an insulating material, such as silicon nitride.

Gate spacers 15 may be provided on sidewalls of the gate dielectric material 6, the gate electrode 9, and the gate mask 12. The gate spacers 15 may include a single layer or a compound layer. For example, the gate spacers 15 may be single spacers including an insulating material, such as silicon nitride. In some embodiments, the gate spacers 15 may include inner spacers including an insulating material, such as silicon oxide, and outer spacers including an insulating material, such as silicon nitride. The inner spacers may be interposed between the outer spacers and the gate electrode 9.

A source region 18s and a drain region 18d may be provided in the active region 3a on both sides of the gate electrode 9. The source and drain regions 18s and 18d may be spaced apart from each other. The source and drain regions 18s and 18d may be symmetrical to each other with respect to the gate electrode 9. In other words, the source and drain regions 18s and 18d may have the same junction depth and the same impurity concentration.

In the active region 3a, a region disposed adjacent or close to the gate dielectric layer 6 between the source and drain regions 18s and 18d may be defined as a main channel impurity region 21.

The main channel impurity region 21 may include at least one of a Group III element and a Group V element. For example, when the first MOS transistor T1 is an NMOS transistor, the main channel impurity region 21 may be P-type containing a Group III element, such as boron (B). In some embodiments, when the first MOS transistor T1 is a PMOS transistor, the main channel impurity region 21 may be N-type containing a Group V element, such as phosphorous (P) or arsenic (As). In addition, the main channel impurity region 21 may be P-type conductive region containing a Group V element, such as P and/or As, at a lower concentration than the Group III element, or an N-type conductive region containing the Group III element at a lower concentration than that of the Group V element, such as P and/or As. All main channel impurity regions exemplified in the present specification may include both the Group III and V elements. However, this description will be omitted hereinafter to facilitate understanding of the inventive concept and avoid redundancy. In other words, it may be described that the main channel impurity regions include any one of the Group III and V elements. Accordingly, even if additional description is not provided, it should be understood that each of the main channel impurity regions described and illustrated in the present specification and drawings may include both the Group III and V elements.

A lightly doped channel impurity region 24a may be provided in the active region 3a adjacent or close to the drain region 18d. The lightly doped channel impurity region 24a may be spaced apart from the source region 18s. The lightly doped channel impurity region 24a may be spaced apart from the gate dielectric layer 6. The lightly doped channel impurity region 24a may form a PN junction along with the drain region 18d.

The lightly doped channel impurity region 24a may have the same conductivity type as the main channel impurity region 21 and a lower channel impurity concentration than the main channel impurity region 21. The lightly doped channel impurity region 24a may contain both a Group III element and a Group V element and have the same conductivity type as the main channel impurity region 21. For example, when the first MOS transistor T1 is an NMOS transistor, the main channel impurity region 21 may have a P-type conductivity containing a Group III element, and the lightly doped channel impurity region 24a may have a P-type conductivity containing both a Group III element and a Group V element. For example, the main channel impurity region 21 and the lightly doped channel impurity region 24a may have a P-type conductivity containing B, and the lightly doped channel impurity region 24a may contain at least one of P and As discussed with respect to addition to B.

In some embodiments, when the first MOS transistor T1 is a PMOS transistor, the main channel impurity region 21 may have an N-type conductivity containing at least one Group V element selected from P and As, and the lightly doped channel impurity region 24a may have an N-type conductivity containing not only the same Group V element as the main channel impurity region 21 but also a Group III element, such as B. As mentioned above, when the main channel impurity region 21 contains both a Group III element and a Group V element, the main channel impurity region 21 and the lightly doped channel impurity region 24a may have the same Group-III impurity concentration and different Group-V impurity concentrations. In some embodiments, the impurity concentration of the Group III element may be much higher than the different concentrations of the Group V element. For example, the main channel impurity region 21 may have a relatively low impurity concentration of the Group V element, while the lightly doped channel impurity region 24a may have a relatively high impurity concentration of the Group V element. In some embodiments, since the main channel impurity region 21 and the lightly doped channel impurity region 24a have the same Group-III impurity concentration, the main channel impurity region 21 may have a higher Group-III impurity concentration than the lightly doped region 24a. The reverse case may also be possible.

When the lightly doped channel impurity region 24a is P-type, the Group III element of the lightly doped channel impurity region 24a may have a higher atomic concentration than the Group V element thereof. In embodiments of the present inventive concept where the lightly doped channel impurity region 24a is N-type, the Group III element of the lightly doped channel impurity region 24a may have a lower atomic concentration than the Group V element thereof.

When the main channel impurity region 21 is P-type, the lightly doped channel impurity region 24a may be a region formed by implanting a Group V element into the active region 3a at a dose from about $0.5 \times 10^{13}$ ions/cm$^2$ to about $1.0 \times 10^{14}$ ions/cm². The Group V element implanted into the main channel impurity region 21 may have a lower atomic concentration than the Group III element of the first channel impurity region 21. Accordingly, the lightly doped channel impurity region 24a may contain a first atom with the same impurity concentration as the main channel impurity region 21, and a second atom with a lower impurity concentration than the first atom. Here, the first atom may be a Group III or V atom, and the second atom may be a Group V or III atom different from the first atom.

Since the lightly doped channel impurity region 24a has a lower channel impurity concentration than the main channel impurity region 21, the generation of hot carriers in the first MOS transistor T1 may be reduced or possibly prevented. Accordingly, the degradation of performance of the first MOS transistor T1 due to hot carrier injection (HCI) or a hot carrier effect (HCE) may be reduced or possibly prevented.

Furthermore, since the lightly doped channel impurity region 24a is spaced apart from a top surface of the active region 3a between the source and drain regions 18s and 18d, a variation in threshold voltage due to the lightly doped channel impurity region 24a may be reduced or possibly prevented.

Accordingly, the first MOS transistor T1 including the gate dielectric material 6, the gate electrode 9, the source and drain regions 18s and 18d, the main channel impurity region 21, and the lightly doped channel impurity region 24a may be provided.

Figure 2:
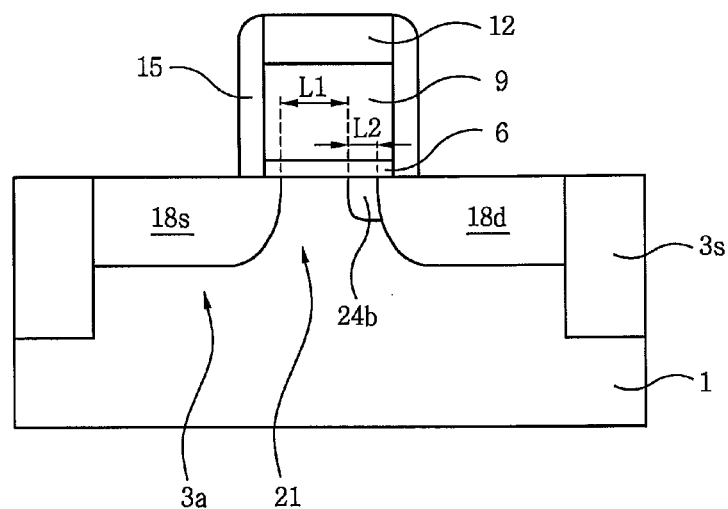

Referring now to FIG. 2, in some embodiments of the present inventive concept, a second MOS transistor T2 including a lightly doped channel impurity region 24b instead of the lightly doped channel impurity region 24a shown in FIG. 1 may be provided. In particular, as illustrated in FIG. 2, the lightly doped channel impurity region 24a of FIG. 1 may be replaced by the lightly doped channel impurity region 24b disposed adjacent or close to the drain region 18d and configured to extend to the top surface of the active region 3a. As discussed above, the modified lightly doped channel impurity region 24b may be adjacent or close to at least a portion of a lateral surface of the drain region 18d.

Meanwhile, since the lightly doped channel impurity region 24b extends to the top surface of the active region 3a between the source and drain regions 18s and 18d, compared to the lightly doped channel impurity region 24a of FIG. 1, the generation of hot carriers may be reduced more than the first MOS transistor T1 of FIG. 1. Thus, performance degradation of the first MOS transistor T1 due to HCI may be reduced or possibly prevented more effectively. Also, as illustrated in the vertical cross-sectional view of FIG. 2, a width L2 of the lightly doped channel impurity region 24b may be less than a width L1 of the main channel impurity region 21. Accordingly, since the area occupied by the lightly doped channel impurity region 24b of the top surface of the active region 3a is smaller than the area of the main channel impurity region 21, the influence of the lightly doped channel impurity region 24b on a variation in the threshold voltage of the second MOS transistor T2 may be reduced.

Figure 3:
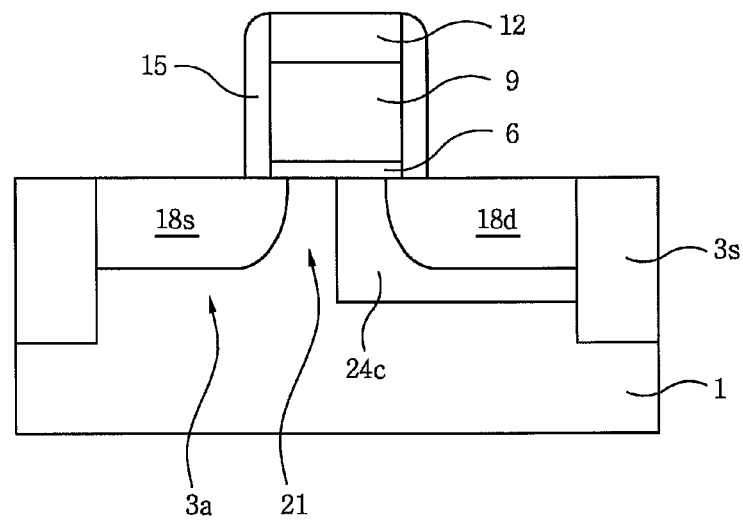

In some embodiments of the present inventive concept, a third MOS transistor T3 including a lightly doped channel impurity region 24c shown in FIG. 3 may be provided. In the third MOS transistor T3, since the lightly doped channel impurity region 24c surrounds lateral and bottom surfaces of the drain region 18d, degradation of electrical properties of the third MOS transistor T3 due to HCI may be greatly reduced.

Embodiments of the inventive concept are not limited to the first through third MOS transistors T1, T2, and T3, and may provide semiconductor devices including variously modified MOS transistors.

Figure 4A:
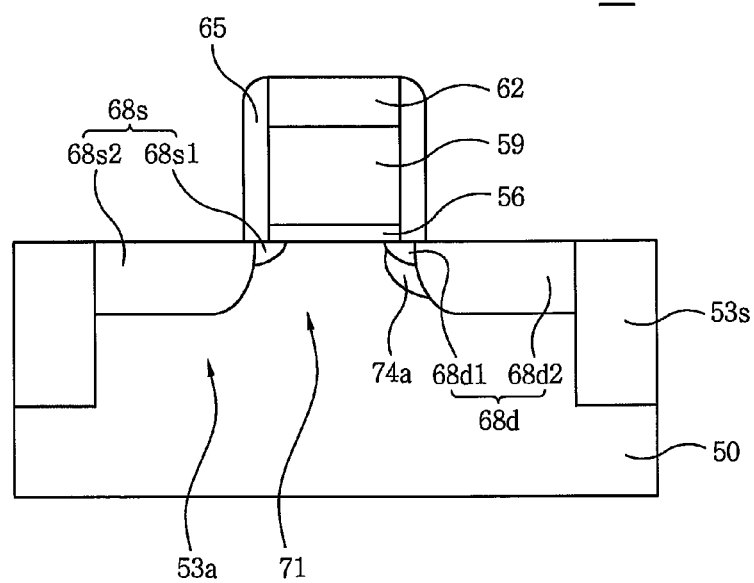

Referring now to FIGS. 4A through 13, various embodiments of MOS transistors in accordance with embodiments of the inventive concept will be discussed. Referring first to FIG. 4A, a semiconductor device including a fourth MOS transistor T4 according to some embodiments of the inventive concept will be discussed. As illustrated in FIG. 4A, an isolation region 53s defining an active region 53a may be provided in a semiconductor substrate 50 as shown in FIG. 1. As discussed with respect to FIG. 1, a gate dielectric material 56, a gate electrode 59, and a gate mask 62 may be sequentially stacked on the active region 53a. Gate spacers 65 may be provided on sidewalls of the gate dielectric material 56, the gate electrode 59, and the gate mask 62.

A source region 68s and a drain region 68d may be disposed in the active region 53a on both sides of the gate electrode 59 and spaced apart from each other in the active region 53a. A region of the active region 53a disposed between the source and drain regions 68s and 68d may be defined as a main channel impurity region 71.

The source region 68s may include a first lightly doped region 68s1 and a first heavily doped region 68s2, and the drain region 68d may include a second lightly doped region 68d1 and a second heavily doped region 68d2. The first and second lightly doped regions 68s1 and 68d1 may have lower impurity concentrations than the first and second heavily doped regions 68s2 and 68d2. The first lightly doped region 68s1 may be in contact with the first heavily doped region 68s2 and extend from the first heavily doped region 68s2 into the main channel impurity region 71. Similarly, the second lightly doped region 68d1 may be in contact with the second heavily doped region 68s2 and extend from the second heavily doped region 68d2 into the main channel impurity region 71. In other words, the source and drain regions 68s and 68d may have a lightly doped drain (LDD) or double doped drain (DDD) structure.

As discussed with respect to FIG. 1, a lightly doped channel impurity region 74a may be provided in the active region 53a adjacent or close to the drain region 68d. In other words, the lightly doped channel impurity region 74a may have the same conductivity type as the main channel impurity region 71 and a lower channel impurity concentration than the main channel impurity region 71.

Furthermore, the lightly doped channel impurity region 74a may be spaced apart from a top surface of the active region 53a as illustrated in FIG. 1. The lightly doped channel impurity region 74a may be disposed adjacent or close to the drain region 68d (i.e., the second lightly doped region 68d1 and/or the second heavily doped region 68d2). In other words, the lightly doped channel impurity region 74a may form a PN junction along with each of the second lightly doped region 68d1 and/or the second heavily doped region 68d2.

Accordingly, the fourth MOS transistor T4 including the source and drain regions 68s and 68d having the LDD structure, the gate dielectric material 56, the gate electrode 59, the main channel impurity region 71, and the lightly doped channel impurity region 74a may be provided. Therefore, the lightly doped channel impurity region 74a and the second lightly doped region 68d1 of the fourth MOS transistor T4 may reduce or possibly prevent degradation of transistor performance due to HCI.

Figure 4B:
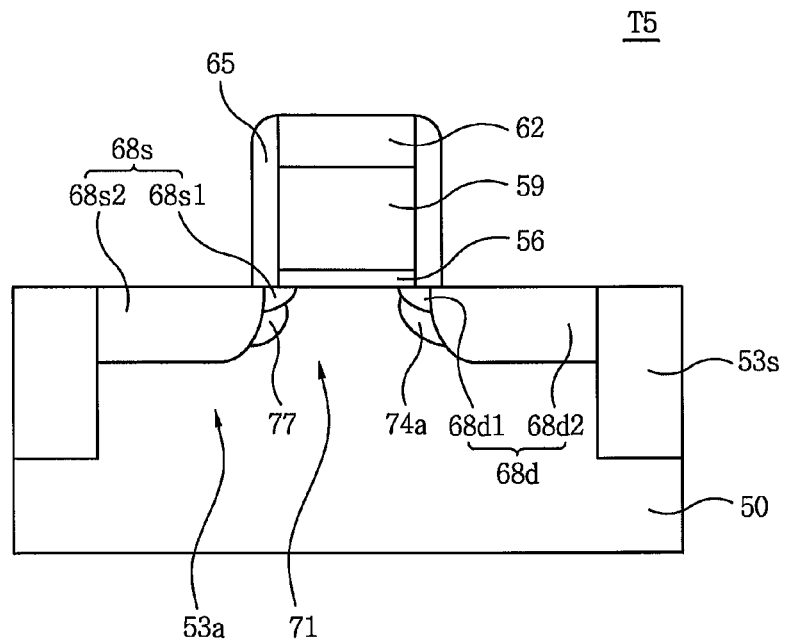

Referring now to FIG. 4B, a semiconductor device including a fifth MOS transistor T5 according to some embodiments of the inventive concept will be discussed. As illustrated in FIG. 4B, the fifth MOS transistor T5 may further include a halo region 77 formed in the active region 53a adjacent or close to the source region 68s in addition to the elements discussed above with respect to FIG. 4A and the fourth MOS transistor T4. The halo region 77 may have the same conductivity type as the main channel impurity region 71 and a higher impurity concentration than the main channel impurity region 71. The halo region 77 may improve off-current (Ioff) characteristics.

Figure 4C:
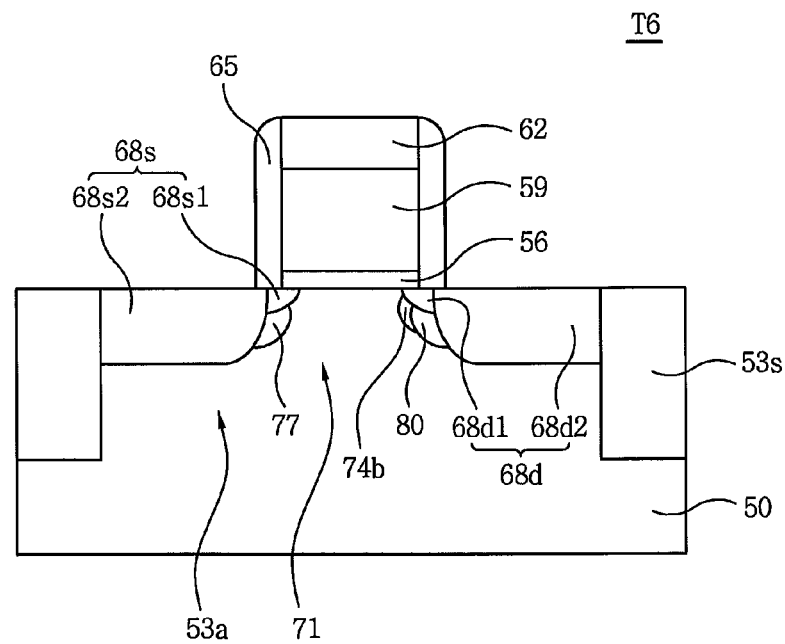

Referring now to FIG. 4C, a semiconductor device including a sixth MOS transistor T6 according to some embodiments of the inventive concept will be discussed. As illustrated in FIG. 4C, the sixth MOS transistor T6 may further include a first halo region 77 and a second halo region 80 in addition to the fifth MOS transistor T5 discussed above with respect to FIG. 4B. The first halo region 77 may be provided in the active region 53a adjacent or close to the source region 68s, while the second halo region 80 may be provided in the active region 53a adjacent or close to the drain region 68d. The first and second halo regions 77 and 80 may be spaced apart from each other.

A lightly doped channel impurity region 74b of the sixth MOS transistor T6 may be formed in the active region 53a adjacent or close to the drain region 68d and the second halo region 80. A junction between the lightly doped channel impurity region 74b and the drain region 68d may be closer to a gate 56 and 59 than a junction between the second halo region 80 and the drain region 68d. The second halo region 80 may be spaced further apart from the gate dielectric material 56 than the second lightly doped region 68d1. The first and second halo regions 77 and 80 may have the same conductivity type as the main channel impurity region 71 and a higher impurity concentration than the main channel impurity region 71.

In embodiments where the sixth MOS transistor T6 is an NMOS transistor, each of the main channel impurity region 71, the lightly doped channel impurity region 74b, and the first and second halo regions 77 and 80 may be P-type, and the first and second halo regions 77 and 80 may have higher P-type impurity concentrations than the main channel impurity region 71. Also, the lightly doped channel impurity region 74b may have P-type conductivity containing a Group III element and a Group V element.

Figure 5A:
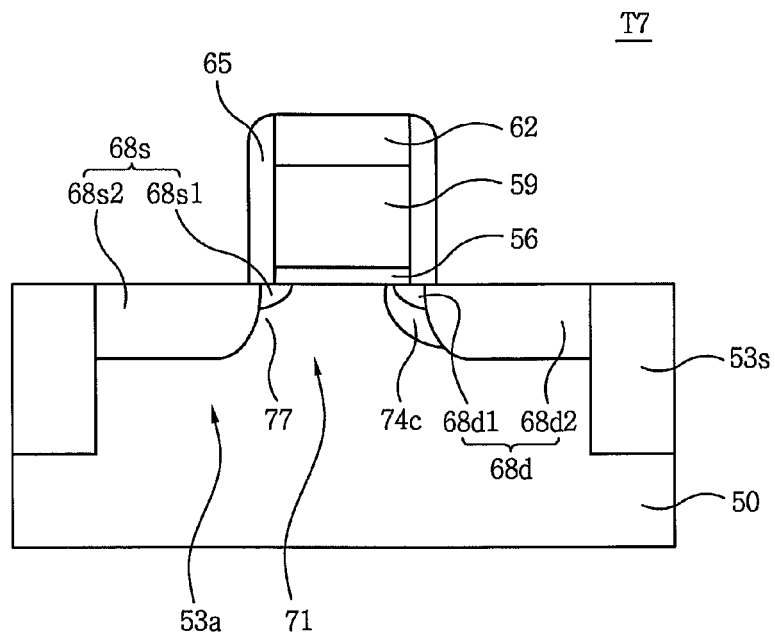

Referring now to FIG. 5A, a semiconductor device including a seventh MOS transistor T7 according to some embodiments of the inventive concept will be discussed. As illustrated in FIG. 5A, the seventh MOS transistor T7 may include a lightly doped channel impurity region 74c which is disposed adjacent or close to the drain region 68d and extends to a top surface of the active region 53a, instead of the lightly doped channel impurity region 74a of the fourth MOS transistor T4 illustrated in FIG. 4A. Since the characteristics of the lightly doped channel impurity region 74c may be easily understood with reference to the lightly doped channel impurity region 24b of FIG. 2, a detailed description thereof will be omitted here.

Figure 5B:
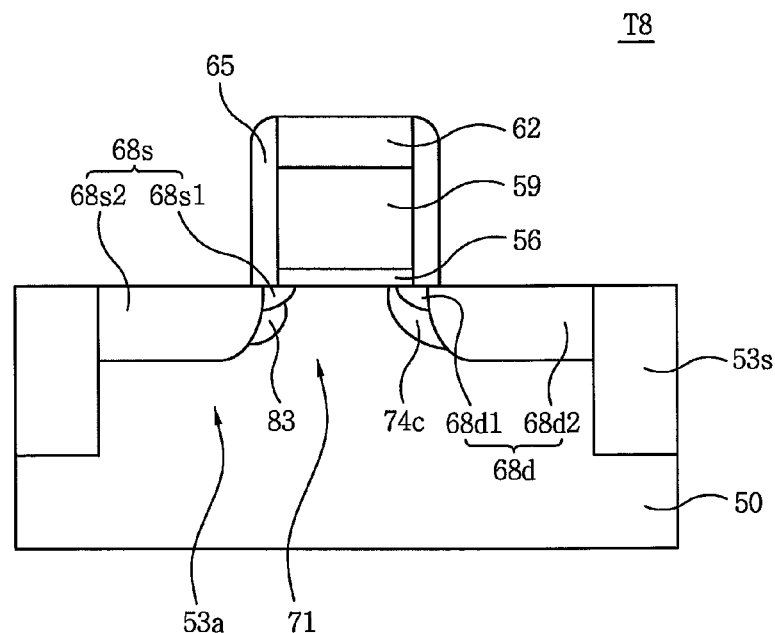

Referring now to FIG. 5B, a semiconductor device including an eighth MOS transistor T8 according to some embodiments of the inventive concept will be discussed. As illustrated in FIG. 5B, the eighth MOS transistor T8 may further include a first halo region 83 formed in the active region 53a adjacent or close to the source region 68s, compared to the seventh MOS transistor T7 of FIG. 5A.

Figure 5C:
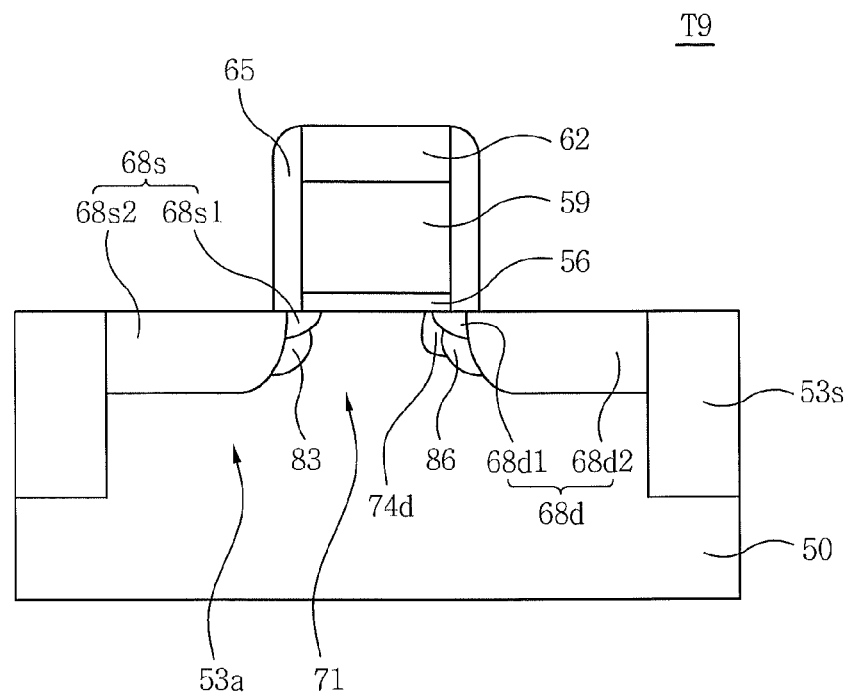

Referring now to FIG. 5C, a semiconductor device including a ninth MOS transistor T9 according to some embodiments of the inventive concept will be discussed. As illustrated in FIG. 5C, the ninth MOS transistor T9 may further include a first halo region 83 formed in the active region 53a adjacent or close to the source region 68s and a second halo region 86 formed in the active region 53a adjacent or close to the drain region 68d, compared to the seventh MOS transistor T7 of FIG. 5A or the eighth MOS transistor T8 of FIG. 5B. Since the first and second halo regions 83 and 86 are substantially the same as the first and second halo regions 77 and 80 of the sixth MOS transistor T6 of FIG. 4C, a detailed description thereof will be omitted here.

Figure 6A:
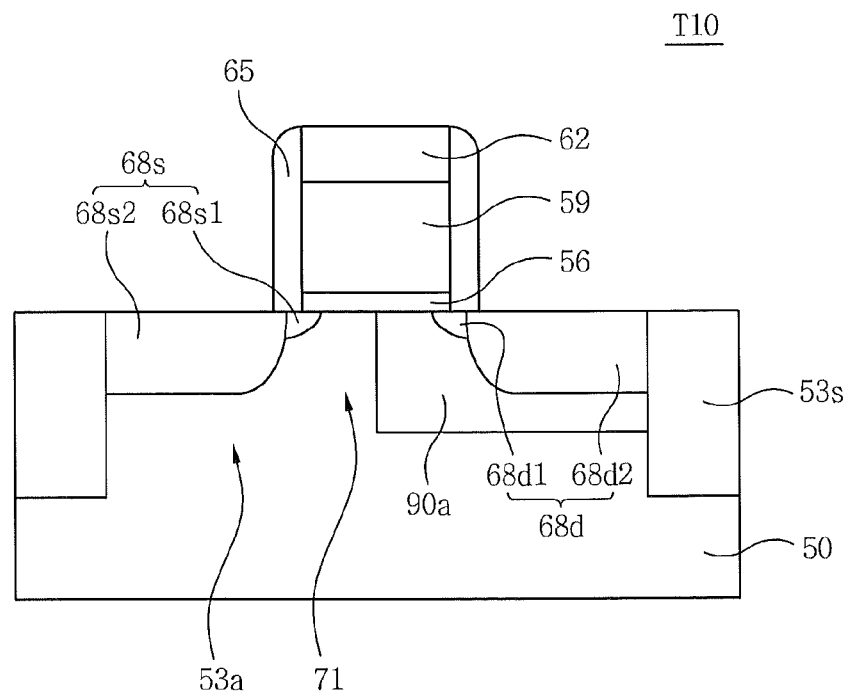

Referring now to FIG. 6A, a semiconductor device including a tenth MOS transistor T10 according to some embodiments of the inventive concept will be discussed. As illustrated in FIG. 6A, the tenth MOS transistor T10 may include a lightly doped channel impurity region 90a which encloses lateral and bottom surfaces of the drain region 68d, instead of the lightly doped channel impurity regions 74a and 74c, compared to the fourth MOS transistor T4 of FIG. 4A or the seventh MOS transistor T7 of FIG. 5A. The lightly doped channel impurity region 90a may correspond to the lightly doped channel impurity region 24c of the third MOS transistor T3 of FIG. 3.

Figure 6B:
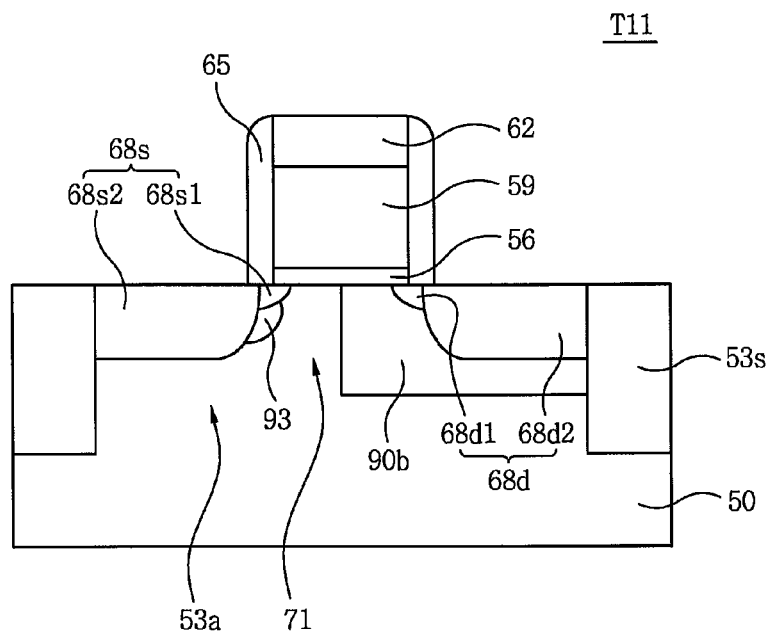

Referring now to FIG. 6B, a semiconductor device including an eleventh MOS transistor T11 according some embodiments of the inventive concept will be discussed. As illustrated in FIG. 6B, the eleventh MOS transistor T11 may further include a first halo region 93 formed in the active region 53a adjacent or close to the source region 68s, compared to the tenth MOS transistor T10 of FIG. 6A.

Figure 6C:
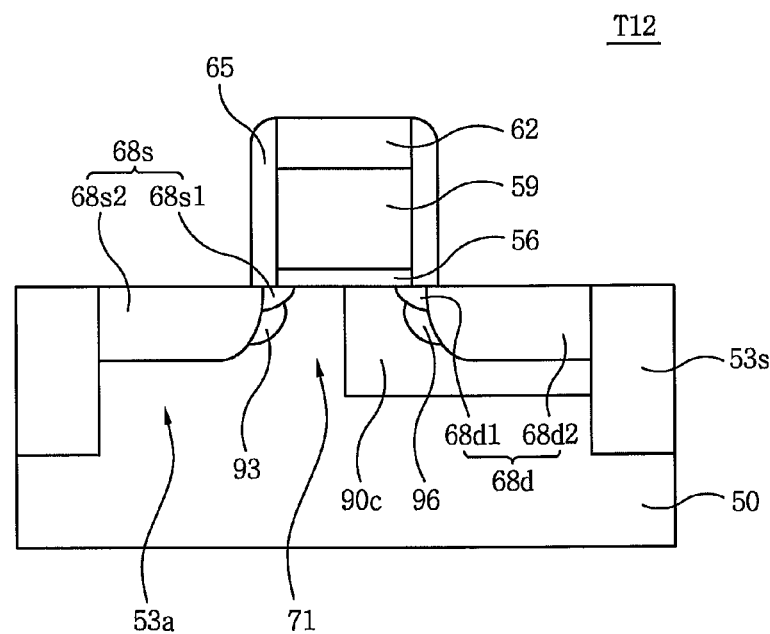

Referring now to FIG. 6C, a semiconductor device including a twelfth MOS transistor T12 according to some embodiments of the inventive concept will be discussed. As illustrated in FIG. 6C, the twelfth MOS transistor T12 may further include a second halo region 96 formed in the active region 53 adjacent or close to the drain region 68d, compared to the eleventh MOS transistor T11 of FIG. 6B.

Figure 7A:
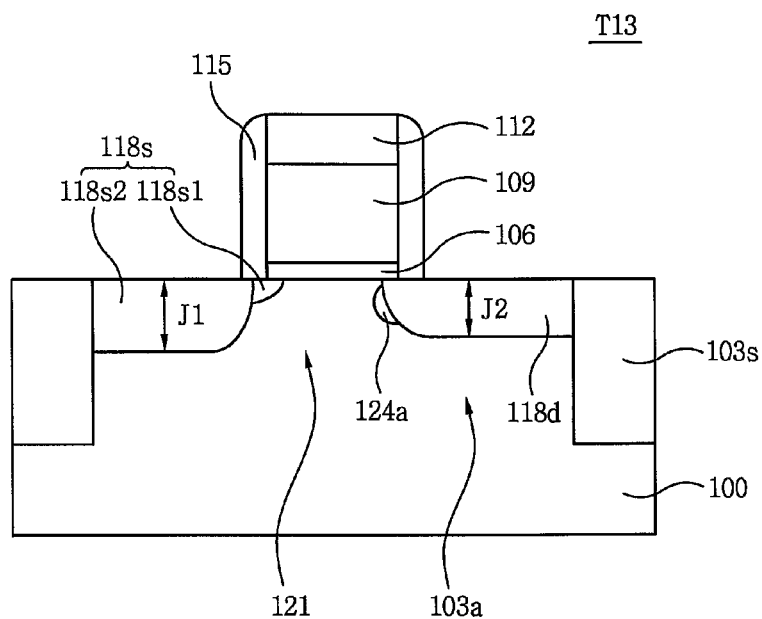

Referring now to FIG. 7A, a semiconductor device including a thirteenth MOS transistor T13 according to some embodiments of the inventive concept will be discussed. As illustrated in FIG. 7A and shown in FIG. 1, an isolation region 103s defining an active region 103a may be provided in a semiconductor substrate 100. As discussed with respect to FIG. 1, a gate dielectric material 105, a gate electrode 109, and a gate mask 112 may be sequentially stacked on the active region 103a. A gate 106 and 109 may be provided across the active region 103a. Gate spacers 115 may be disposed on sidewalls of the gate dielectric material 106, the gate electrode 109, and the gate mask 112.

A source region 118s and a drain region 118d may be provided in the active region 103a on both sidewalls of the gate electrode 109 and spaced apart from each other. A region of the active region 103a interposed between the source and drain regions 118s and 110d may be defined as a main channel impurity region 121.

The drain region 118d may have a different junction depth than the source region 118s. For example, the drain region 118d may have a shallower junction depth than the source region 118s. The source region 118s may include a first lightly doped region 118s1 and a first heavily doped region 118s2. The first lightly doped region 118s1 may extend from the first heavily doped region 118s2 into the main channel impurity region 121 disposed under the gate electrode 109. The first heavily doped region 118s2 of the source region 118s may have a first junction depth J1, and the drain region 118d may have a second junction depth J2 less than the first junction depth J1.

A lightly doped channel impurity region 124a may be provided in the active region 103a adjacent or close to the drain region 118d. The lightly doped channel impurity region 124a may be spaced apart from a top surface of the active region 103a. The lightly doped channel impurity region 124a may be substantially the same as the lightly doped channel impurity region 24a of FIG. 1.

Figure 7B:
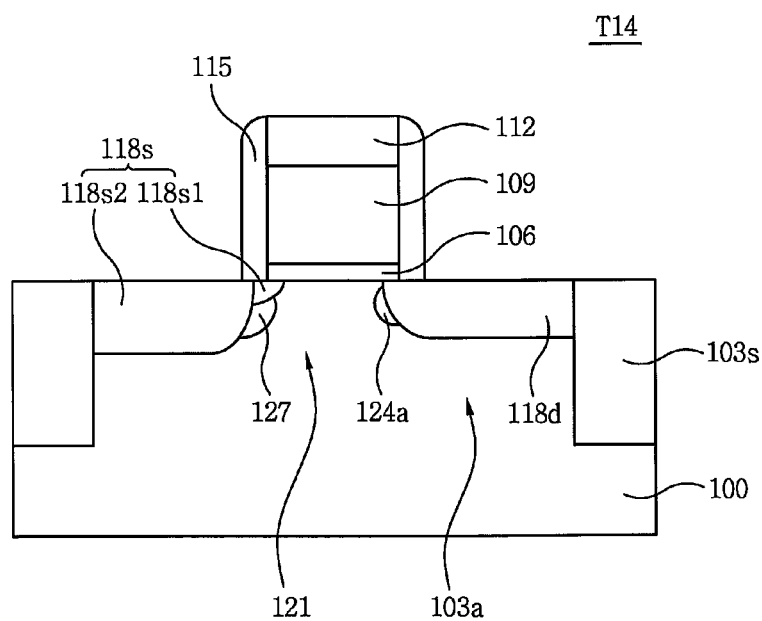

Referring now to FIG. 7B, a semiconductor device including a fourteenth MOS transistor T14 according to some embodiments of the inventive concept will be discussed. As illustrated in FIG. 7B, the fourteenth MOS transistor T14 may further include a halo region 127 formed in the active region 121 adjacent or close to the source region 118s, compared to the thirteenth MOS transistor 13 of FIG. 7A. The halo region 127 may correspond to the halo region 77 of the fifth MOS transistor T5 of FIG. 4B.

Figure 8A:
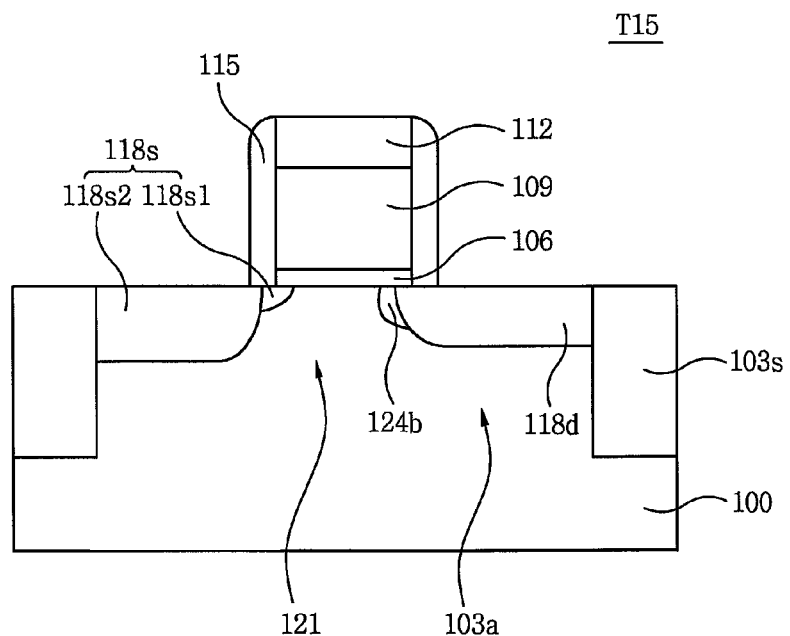

Referring now to FIG. 8A, a semiconductor device including a fifteenth MOS transistor T15 according to some embodiments of the inventive concept will be discussed. As illustrated in FIG. 8A, the fifteenth MOS transistor T15 may include a lightly doped channel impurity region 124b which is disposed adjacent or close to the drain region 118d and extends to a top surface of the active region 103a, instead of the lightly doped channel impurity region 124a of the thirteenth MOS transistor T13, compared to the thirteenth MOS transistor T13 of FIG. 7A.

Figure 8B:
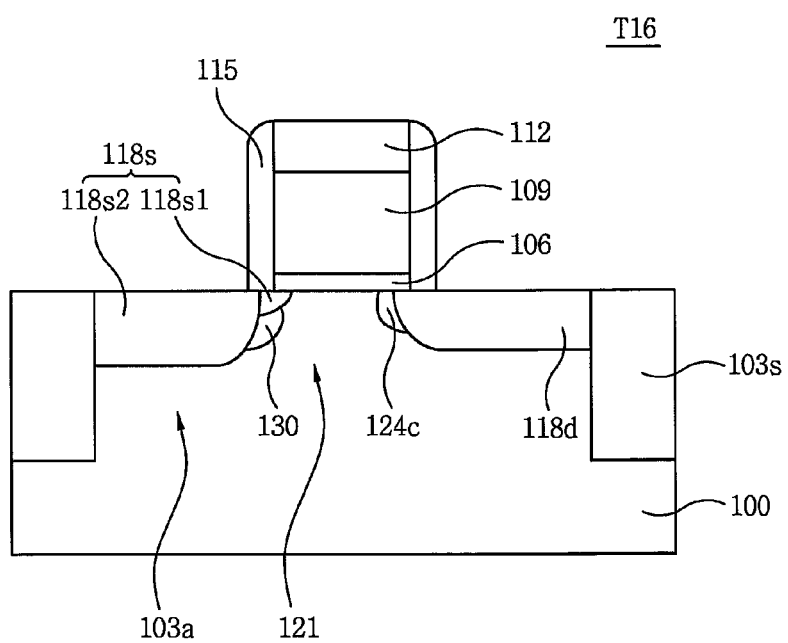

Referring now to FIG. 8B, a semiconductor device including a sixteenth MOS transistor T16 according to some embodiments of the inventive concept will be discussed. As illustrated in FIG. 8B, the sixteenth MOS transistor T16 may further include a halo region 130 formed in the active region 121 adjacent or close to the source region 118s, compared to the fifteenth MOS transistor 15 of FIG. 8A.

Figure 9A:
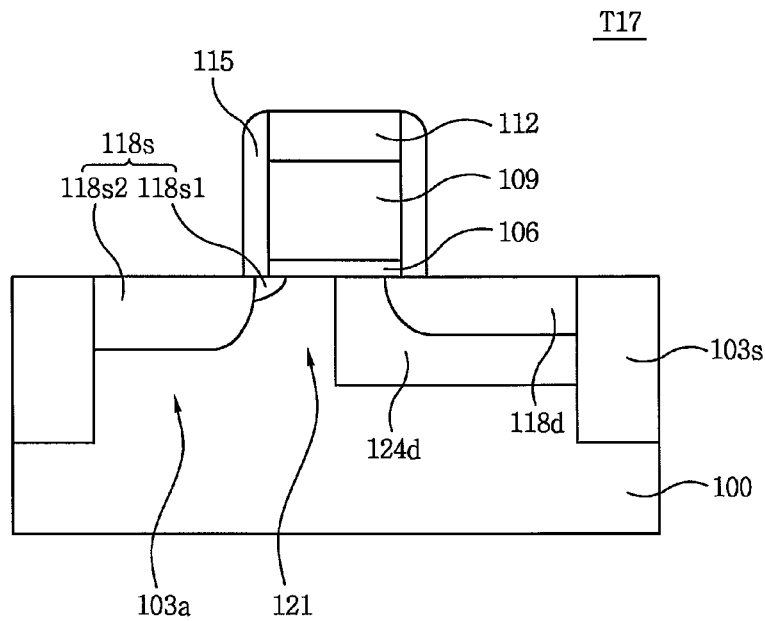

Referring now to FIG. 9A, a semiconductor device including a seventeenth MOS transistor T17 according to some embodiments of the inventive concept will be discussed. As illustrated in FIG. 9A, the seventeenth MOS transistor T17 may include a lightly doped channel impurity region 124d which may surround lateral and bottom surfaces of the drain region 118d, instead of the lightly doped channel impurity region 124a of the thirteenth MOS transistor T13, compared to the thirteenth MOS transistor T13 of FIG. 7A.

Figure 9B:
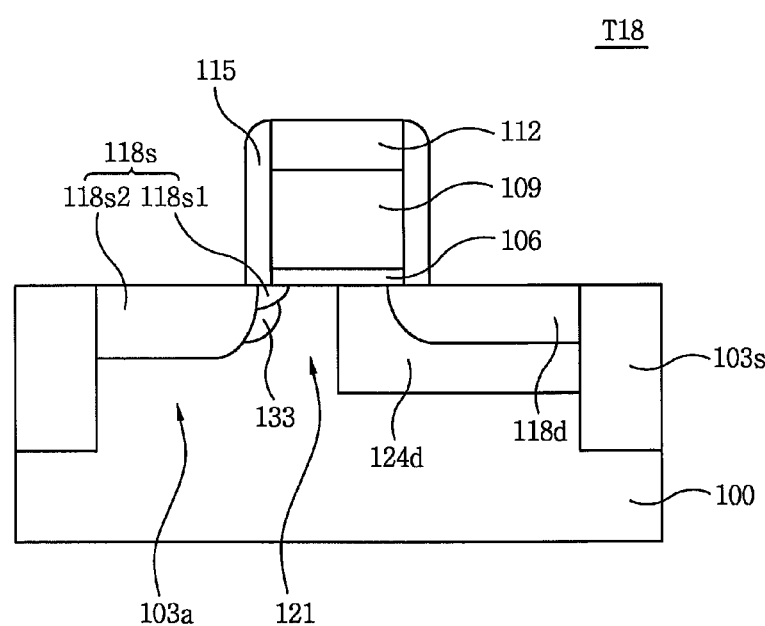

Referring now to FIG. 9B, a semiconductor device including an eighteenth MOS transistor T18 according to some embodiments of the inventive concept will be discussed. As illustrated in FIG. 9B, the eighteenth MOS transistor T18 may further include a halo region 133 formed in the active region 131 adjacent or close to the source region 118s, compared to the seventeenth MOS transistor T17 of FIG. 9A.

Figure 10:
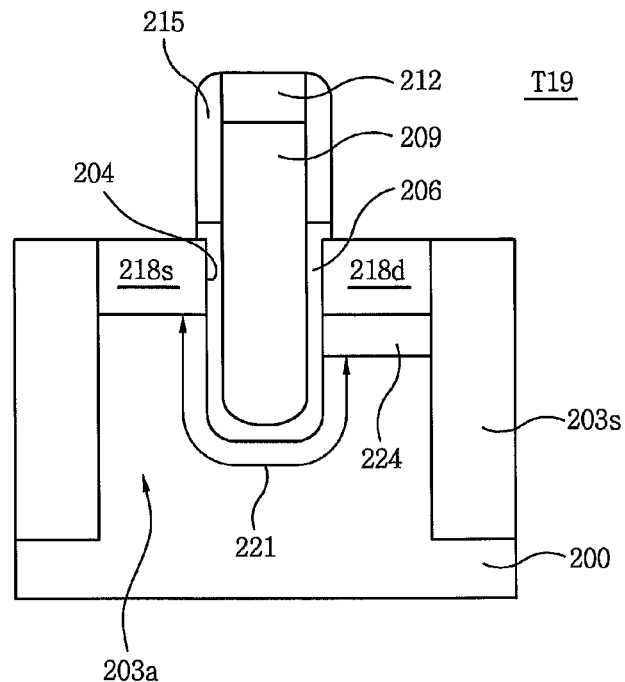

Referring now to FIG. 10, a semiconductor device including a nineteenth MOS transistor T19 according to some embodiments of the inventive concept will be discussed. As illustrated in FIG. 10, an isolation region 203s defining an active region 203a may be provided in a semiconductor substrate 200 as shown in FIG. 1. A gate trench 204 may be provided across the active region 203a. A gate 206 and 209 may be provided to fill the gate trench 204. The gate 206 and 209 may include a gate electrode 209 disposed in the gate trench 204, and a gate dielectric material 206 interposed between the gate electrode 209 and an inner wall of the gate trench 204.

The gate electrode 209 may have a portion protruding from the active region 203a onto a surface of the semiconductor substrate 200. A gate mask 212 may be provided on the gate electrode 209. Gate spacers 215 may be provided on the protruding portion of the gate electrode 209 and sidewalls of the gate mask 212.

A source region 218s and a drain region 218d may be disposed in the active region 203 on both sides of the gate electrode 209, and provided adjacent or close to the surface of the semiconductor substrate 200. A main channel impurity region 221 may be provided in the active region 203 between the source and drain regions 218s and 218d. The main channel impurity region 221 may be formed to surround the gate trench 204 in the active region 203a adjacent or close to a sidewall and bottom surface of the gate trench 204. A lightly doped channel impurity region 224 may be provided between the main channel impurity region 221 and the drain region 218d. The nineteenth MOS transistor T19 may include a channel region having the main channel impurity region 221 and the lightly doped channel impurity region 224.

The main channel impurity region 221 and the lightly doped channel impurity region 224 may respectively correspond to and have substantially the same characteristics as the main channel impurity region 21 and the lightly doped channel impurity region 24a described with reference to FIG. 1. In other words, the lightly doped channel impurity region 224 may reduce or possibly prevent degradation of transistor performance due to HCI. Accordingly, the nineteenth MOS transistor T19 may have an increased effective channel length, and reduce or possibly prevent degradation of transistor performance due to SCE and HCI.

Figure 11:
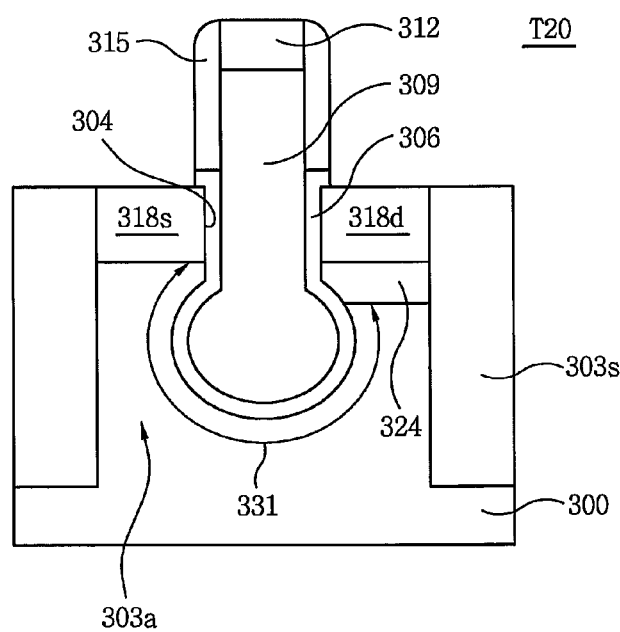

Referring now to FIG. 11, a semiconductor device including a twentieth MOS transistor T20 according to some embodiments of the inventive concept will be discussed. As illustrated in FIG. 11, an isolation region 303s defining an active region 303a may be provided in a semiconductor substrate 300 as shown in FIG. 1. A gate trench 304 may be provided across the active region 303a. The gate trench 304 may have a lower trench region and an upper trench region having different widths. To further increase the effective channel length of the twentieth MOS transistor T20, the gate trench 304 may include the lower trench region having a greater width than the upper trench region.

A gate electrode 309 may be provided within the gate trench 304. A gate dielectric material 306 may be provided between the gate electrode 309 and an inner wall of the gate trench 304. The gate electrode 309 may have a portion protruding from the active region 303a. A gate mask 312 may be provided on the gate electrode 309. Gate spacers 315 may be provided on the protruding portion of the gate electrode 309 and sidewalls of the gate mask 312.

A source region 318s and a drain region 318d may be provided in the active region 303 on both sides of the gate electrode 309. As discussed with respect to FIG. 10, a main channel impurity region 321 may be provided in the active region 303 between the source and drain regions 318s and 318d, while a lightly doped channel impurity region 324 may be provided between the main channel impurity region 221 and the drain region 218d.

Figure 12:
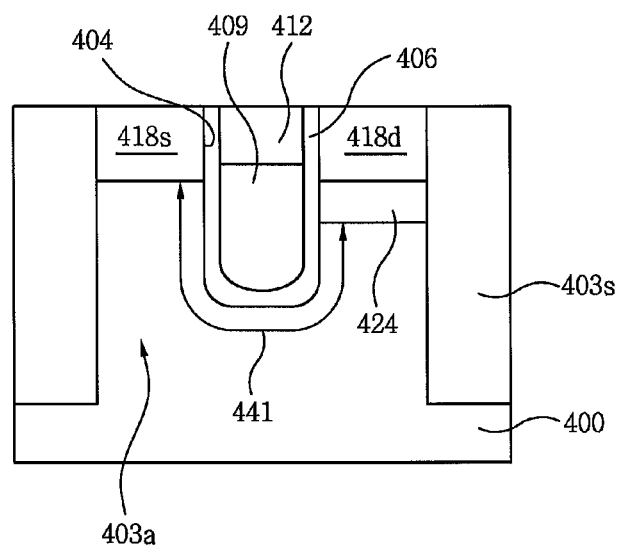

Referring now to FIG. 12, a semiconductor device including a twenty-first MOS transistor T21 according to some embodiments of the inventive concept will be discussed. As illustrated in FIG. 12, an isolation region 403s defining an active region 403a may be provided in a semiconductor substrate 400. A gate trench 404 may be provided across the active region 403a.

A gate electrode 409 may be provided to partially fill the gate trench 404. A gate mask 412 having insulation characteristics may be provided on the gate electrode 409. A gate dielectric material 406 may be provided between the gate electrode 409 and an inner wall of the gate trench 404. The gate electrode 409, the gate dielectric material 406, and the gate mask 412 may fill the gate trench 404.

A source region 418s and a drain region 418d may be provided in the active region 403a on both sides of the gate electrode 409. As discussed with respect to FIG. 10, a main channel impurity region 441 may be provided between the source and drain regions 418s and 418d, while a lightly doped channel impurity region 424 may be provided between the drain region 418d and the main channel impurity region 441.

Each or a combination of the above-described first through twenty-first MOS transistors T1 through T21, may be used by semiconductor designers. Each or a combination of the above-described first through twenty-first MOS transistors T1 through T21, may be used for a semiconductor integrated circuit (IC). Hereinafter, a CMOS device including two MOS transistors arbitrarily selected from the first through twenty-first MOS transistors T1 through T21, will be described with reference to FIG. 13. However, the inventive concept is not limited thereto and each of the first through twenty-first MOS transistors T1 through T21, or one of various combinations thereof may constitute a semiconductor IC.

Figure 13:
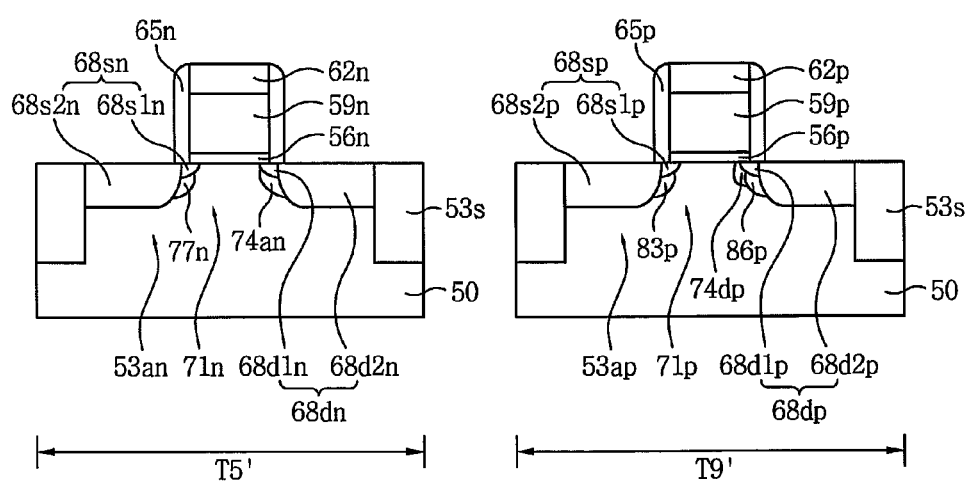

Referring now to FIG. 13, an isolation region 53s defining an NMOS active region 53a n and a PMOS active region 53a p may be provided in a semiconductor substrate 50. An NMOS transistor T5' including substantially similar components as the fifth MOS transistor T5 described with reference to FIG. 4B may be provided in the NMOS active region 53an. More specifically, a first gate dielectric material 56n, a first gate electrode 59n, and a first gate mask 62n may be provided on the NMOS active region 53a n. First gate spacers 65n may be provided on sidewalls of the first gate dielectric material 56n, the first gate electrode 59n, and the first gate mask 62n. An N-type first source region 68sn and an N-type first drain region 68dn may be provided in the active region 53an on both sides of the first gate electrode 59n. A halo region 77n may be provided in the NMOS active region 53an adjacent or close to the source region 68sn. A region of the active region 53an interposed between the first source and drain regions 68sn and 68dn may be defined as an NMOS main channel impurity region 71n. The first source and drain regions 68sn and 68dn may have an LDD or DDD structure including lightly doped regions 68s1n and 68d1n and heavily doped regions 68s2n and 68d2n. A P-type lightly doped channel impurity region 74an may be provided in the active region 53an adjacent or close to the first drain region 68dn.

In addition, a PMOS transistor T9' including substantially the same components as the ninth MOS transistor T9 described with reference to FIG. 5C may be provided in the PMOS active region 53ap. In other words, like the NMOS transistor T5', the PMOS transistor T9' may include components corresponding to components of the ninth MOS transistor T9, specifically, a second gate dielectric material 56p, a second gate electrode 59p, a second gate mask 62p, second gate spacers 65p, a second source region 68sn, and a second drain region 68dn. The second source and drain regions 68sp and 68dp may have an LDD structure including heavily doped regions 68s2p and 68d2p and lightly doped regions 68s1p and 68d1p. A first halo region 83p may be formed in the PMOS active region 53ap adjacent or close to the second source region 68sp, while and a second halo region 86p may be formed in the PMOS active region 53ap adjacent or close to the second drain region 68dp.

A region of the active region 53ap interposed between the second source and drain regions 68sp and 68dp may be defined as a main channel impurity region 71p. A P-type lightly doped channel impurity region 74ap may be provided in the PMOS active region 53ap adjacent or close to the second drain region 68dp.

Processing steps in the fabrication of semiconductor devices including the above-described MOS transistors will now be discussed with respect to FIGS. 14A through 18B.

Figure 14A:
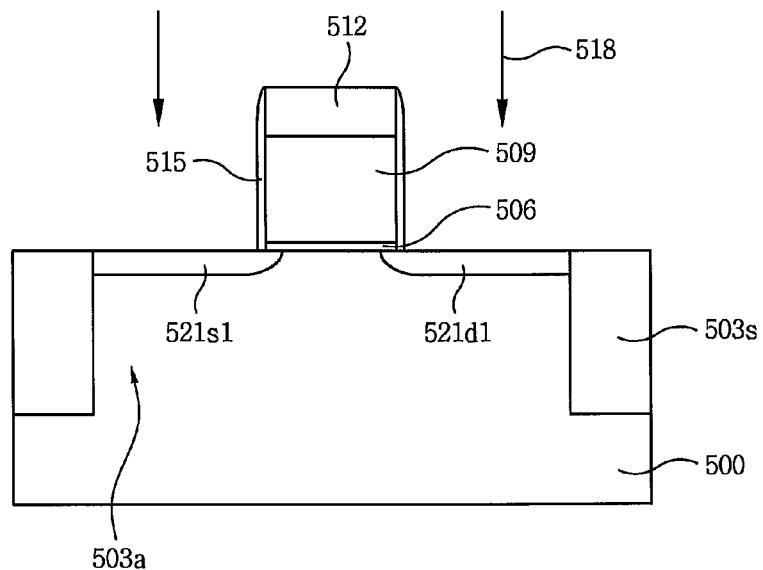
FIGS. 14A through 15 are cross-sections illustrating processing steps in the fabrication of semiconductor devices according to some embodiments of the inventive concept.

Referring first to FIG. 14A, a semiconductor substrate 500 may be provided. The semiconductor substrate 500 may be a semiconductor wafer formed of a semiconductor material, such as silicon (Si). An isolation region 503s defining an active region 503a may be formed in the semiconductor substrate 500. The isolation region 503s may be formed using, for example, an STI technique.

Before or after forming the isolation region 503s, impurities of a Group III or V element may be implanted into the semiconductor substrate 500 using, for example, a well ion implantation process. Meanwhile, impurities for controlling a threshold voltage may be implanted into the active region 503a.

A gate dielectric material 506, a gate electrode 509, and a gate mask 512 may be sequentially stacked on the active region 503a. For example, the gate dielectric material 506 may be formed to contain at least one of silicon oxide and a high-k dielectric material, the gate electrode 509 may be formed to contain at least one of a doped poly-Si layer, a metal silicide layer, and a metal layer, and the gate mask 512 may include an insulating material, such as silicon nitride.

Inner spacers 515 may be formed on sidewalls of the gate dielectric material 506, the gate electrode 509, and the gate mask 512. The inner spacers 515 may be formed of an insulating material, such as silicon oxide.

By performing a low-concentration ion implantation process 518, first and second lightly doped regions 521s1 and 521d1 may be formed in the active region 503a on both sides of the gate electrode 509. The first and second lightly doped regions 521s1 and 521d1 may have a different conductivity type from the active region 503a.

Figure 14B:
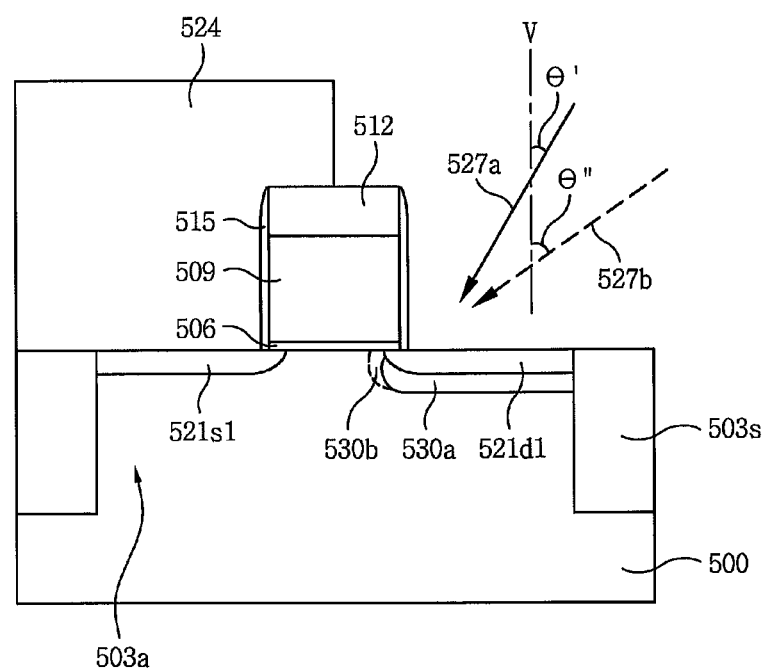

Referring now to FIG. 14B, a channel ion implantation mask 524 having an opening may be formed on the semiconductor substrate 500 to cover the first lightly doped region 521s1 and expose the second lightly doped region 521d1. The channel ion implantation mask 524 may be formed using a photoresist pattern.

Channel ion implantation processes 527a and 527b may be performed using the channel ion implantation mask 524, the gate electrode 509, and the gate mask 512 as an ion implantation mask so that lightly doped channel impurity regions 530a and 530b can be formed in the active region 503a.

The channel ion implantation processes 527a and 527b may be performed at a dose from about $0.5 \times 10^{13}$ to about $1.0 \times 10E^{14}$ ions/cm$^2$ with an ion energy from about 10 to about 60 KeV. Furthermore, the channel ion implantation processes 527a and 527b may be oblique ion implantation processes. For example, the channel ion implantation processes 527a and 527b may be performed such that impurity ions are implanted into the active region 503a disposed under the gate electrode 509 at an angle of from about 5 to about 60° with respect to a virtual line V normal to the semiconductor substrate 500.

When the active region 53a is P-type, impurities implanted due to the channel ion implantation processes 527a and 527b may be ions of a Group V element, for example, P or As. Here, the Group V element implanted due to the channel ion implantation processes 527a and 527b may reduce or possibly prevent the conductivity type of the active region 503a from being changed from the P-type to an N-type, and reduce the P-type impurity concentration of the active region 503a. Accordingly, the lightly doped channel impurity regions 530a and 530b may contain both the Group III and V elements and have a lower P-type impurity concentration than the active region 503a disposed adjacent or close thereto.

Positions of the lightly doped channel impurity regions 530a and 530b in the active region 503a may vary according to an ion implantation angle. For example, a first channel ion implantation process 527a may be performed to implant impurity ions into the active region 503a at a first angle θ', thereby forming the first lightly doped channel impurity region 530a in the active region 503a. Here, the first lightly doped channel impurity region 530a may be formed apart from the top surface of the active region 503a. In another case, a second channel ion implantation process 527b may be performed to implant impurity ions into the active region 503a at a second angle θ", thereby forming a second lightly doped channel impurity region 530b in the active region 503a. In these embodiments, the first lightly doped channel impurity region 530a may extend from the active region 503a to the top surface of the active region 503a.

Therefore, the above-described MOS transistors may have different lightly doped channel impurity regions according to ion implantation angles, doses, and ion energy. For example, according to the ion implantation angle, dose, and ion energy, the first lightly doped channel impurity region 530a may be formed apart from the top surface of the active region 503a like the lightly doped channel impurity region 24a of the first MOS transistor T1 of FIG. 1, or the second lightly doped channel impurity region 530b may be formed to extend from the active region 503a to the top surface of the active region 503a like the lightly doped channel impurity region 24b of the second MOS transistor T2 of FIG. 2.

Since a MOS transistor having the second lightly doped channel impurity region 530b and a MOS transistor having the first lightly doped channel impurity region 530a are formed using substantially the same process except for a channel ion implantation process, the MOS transistor having the first lightly doped channel impurity region 530a will be chiefly described for brevity. Subsequently, the channel ion implantation mask 524 may be removed.

Figure 14C:
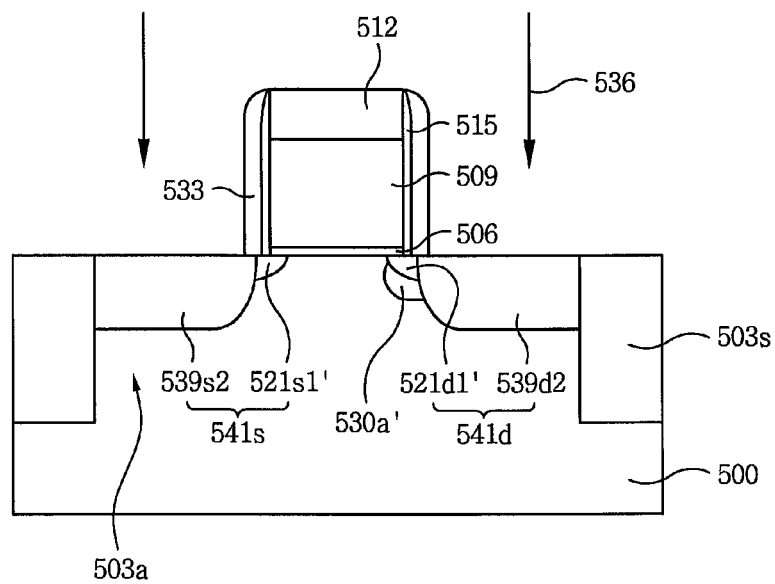

Referring now to FIG. 14C, outer spacers 533 may be formed on the inner spacers 515. The outer spacers 533 may include an insulating material, such as silicon nitride.

A high-concentration ion implantation process 536 may be performed so that a first heavily doped region 539s2 and a second heavily doped region 539d2 can be formed in the active region 503a on both sides of the gate electrode 509. Thus, a source region 541s including the first heavily doped region 539s2 and the first lightly doped region 521s1' may be formed, while a drain region 541d including the second heavily doped region 539d2 and the second lightly doped region 521d1' may be formed.

Thus, the same MOS transistor as the fourth MOS transistor T4 of FIG. 4A may be formed. However, the same MOS transistor as the seventh MOS transistor T7 of FIG. 5A may be formed using the second channel ion implantation process 527b of FIG. 14B.

Figure 15:
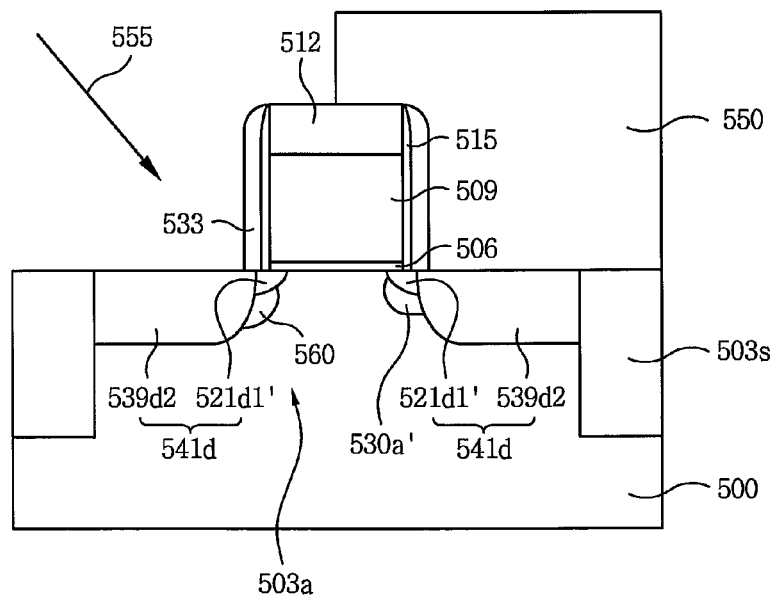

Furthermore, as illustrated in FIG. 15, a halo ion implantation mask 550 may be formed to cover the active region 503a where the drain region 541d of the semiconductor substrate 500 is disposed and expose the active region 503a where the source region 541s is disposed. Thereafter, a halo ion implantation process 555 may be performed using the halo ion implantation mask 550, the gate electrode 509, and the gate mask 512 as an ion implantation mask, thereby forming a halo region 560 in the active region 503a disposed adjacent or close to the source region 541s. The halo ion implantation process 555 may be an oblique ion implantation process. Thereafter, the halo ion implantation mask 550 may be removed. Accordingly, the same MOS transistor as the fifth MOS transistor T5 of FIG. 4B may be formed.

In some embodiments, the halo ion implantation process 555 may be performed before the outer spacers 533 are formed. For example, the halo ion implantation process 555 may be performed after the low-concentration ion implantation process 518, or after the channel ion implantation processes 527a and 527b.

Furthermore, the halo ion implantation process 555 may be performed without using the halo ion implantation mask 550. As a result, the same MOS transistor as the sixth MOS transistor T6 of FIG. 4C may be formed.

As discussed above, the low-concentration ion implantation process 518, the channel ion implantation processes 527a and 527b, and the halo ion implantation process 555 may be performed in a sequential order, but the inventive concept is not limited thereto. In other words, the low-concentration ion implantation process 518, the channel ion implantation processes 527a and 527b, and the halo ion implantation process 555 may be performed in a different order than described above.

Figure 16A:
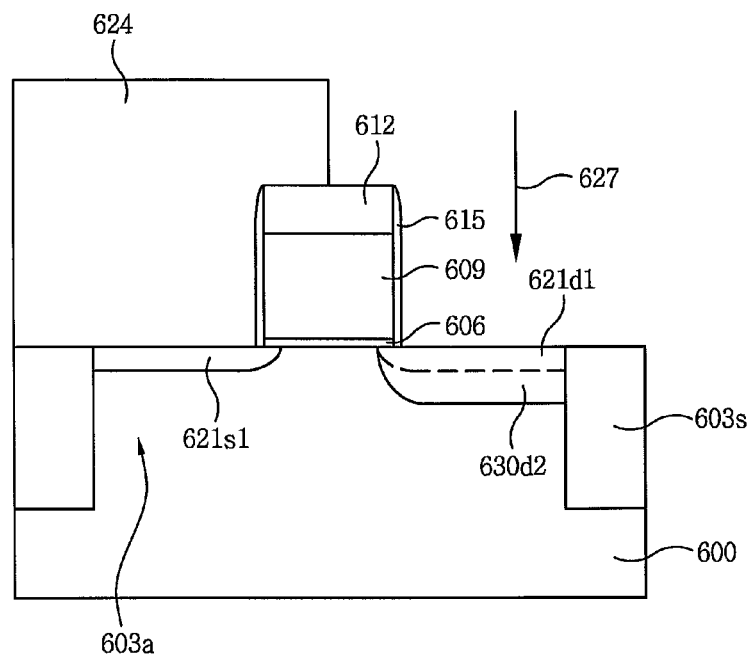
FIGS. 16A through 16D are cross-sections illustrating processing steps in the fabrication of semiconductor devices in accordance with some embodiments of the inventive concept.

Referring now to FIGS. 16A through 16D, processing step in the fabrication of semiconductor devices including a MOS transistor having an asymmetric source/drain structure in accordance with various embodiments of the inventive concept will be discussed. As illustrated in FIG. 16A, an isolation region 603s defining an active region 603a may be formed in a semiconductor substrate 500 as shown in FIG. 14A. A gate dielectric material 606, a gate electrode 609, and a gate mask 612 may be sequentially stacked on the active region 603a. Inner spacers 615 may be formed on sidewalls of the gate dielectric material 606, the gate electrode 609, and the gate mask 612. The inner spacers 615 may be omitted. As discussed with respect to FIG. 14A, first and second lightly doped regions 621s1 and 621d1 may be formed in the active region 603a on both sides of the gate electrode 609 using a low-concentration ion implantation process.

Subsequently, after an ion implantation mask 624 is foamed to cover the first lightly doped region 621s1 and expose the second lightly doped region 621d1, a drain ion implantation process 627 may be performed to form a drain region 630d2 in the active region 503a. Since the drain region 630d2 is formed to have a deeper junction than the second lightly doped region 621d1, the drain region 630d may include the second lightly doped region 621d1.

Figure 16B:
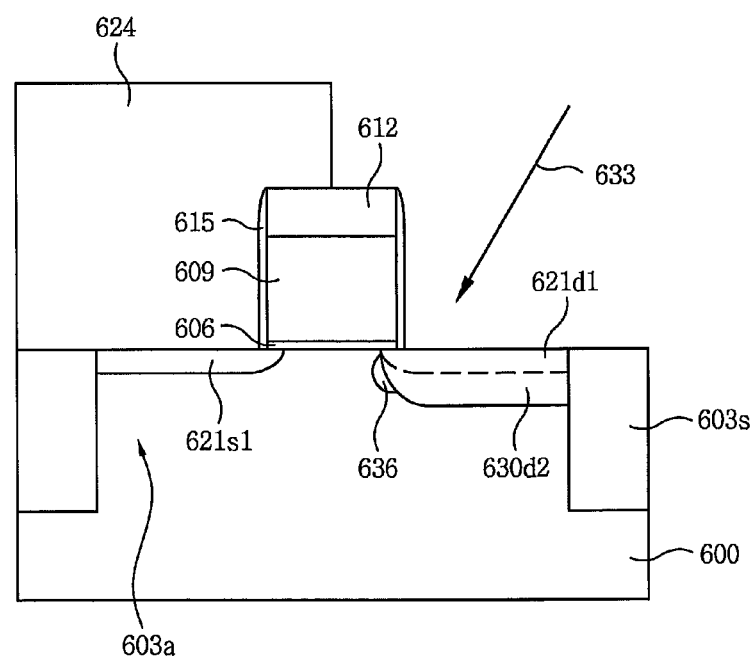

Referring now to FIG. 16B, As discussed with respect to FIG. 14B, a channel impurity ion implantation process 633 may be performed to form a lightly doped channel impurity region 636 in the active region 603a. Thereafter, the ion implantation mask 624 may be removed.

Figure 16C:
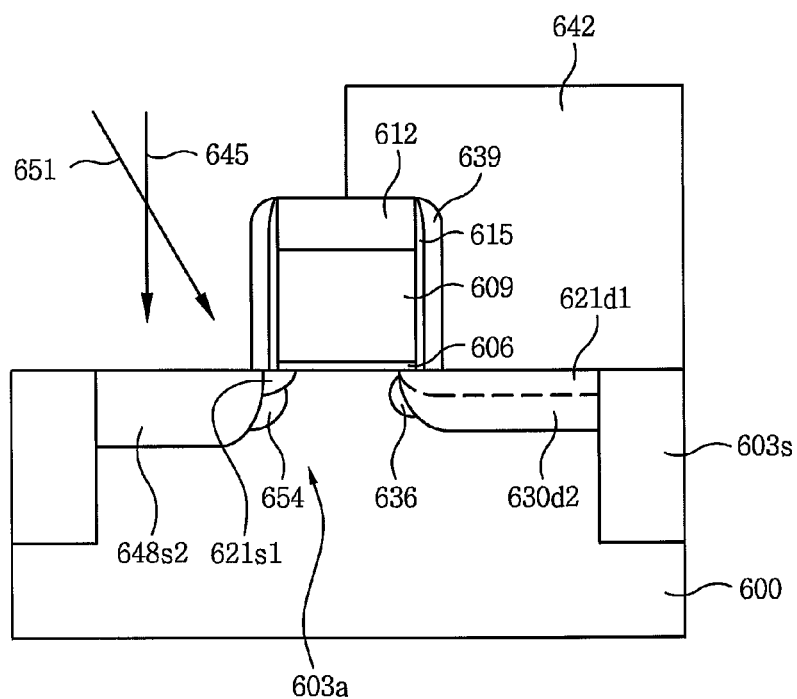

Referring now to FIG. 16C, outer spacers 639 may be formed on the inner spacers 615. A source ion implantation mask 642 may be formed to cover the drain region 630d2 and expose an active region disposed opposite the drain region 630d across the gate electrode 609. Thereafter, impurities may be implanted into the exposed active region using a source ion implantation process 645, thereby forming a heavily doped region 648s2.

In some embodiments, a halo ion implantation process 651 may be performed using the source ion implantation mask 642, thereby forming a halo region 654. However, the halo ion implantation process 651 may be performed before the source ion implantation process 651 or before the formation of the outer spacers 639.

It will be understood that the halo ion implantation process 651, the drain ion implantation process 627, the low-concentration ion implantation process, and the channel ion implantation process 633 are not limited to the above-described sequential order and may be performed in any other sequential order.

Figure 16D:
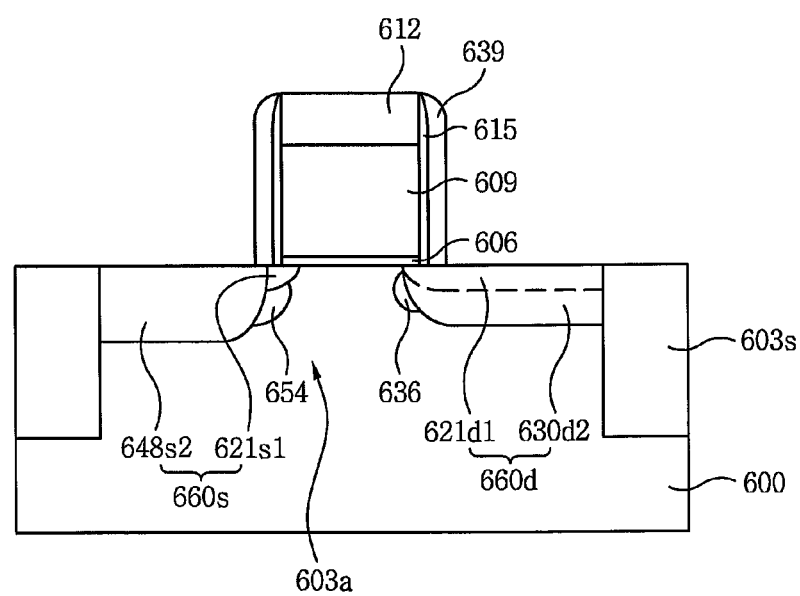

Referring now to FIG. 16D, the source ion implantation mask 642 may be removed so that the heavily doped region 648s2 and the lightly doped region 621s1 can constitute an LDD source region 660s. Also, a drain region 660d may contain at least two kinds of elements due to two regions 621d1 and 630d2 formed using two ion implantation processes. For example, the drain region 660d, which is an NMOS region, may contain both P and As. Accordingly, a MOS transistor similar to the fourteenth MOS transistor T14 of FIG. 7B may be formed.

Figure 17A:
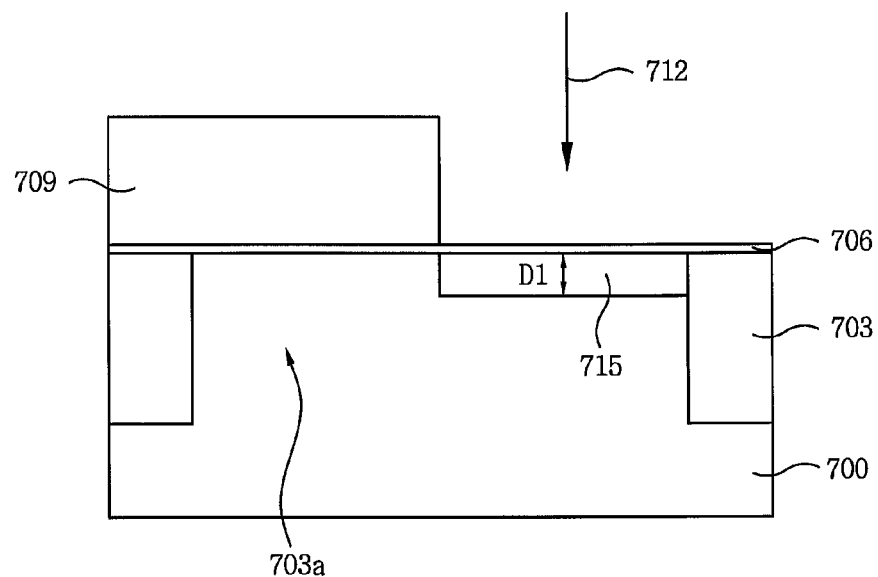
FIGS. 17A and 17B are cross-sections illustrating processing steps in the fabrication of semiconductor devices in accordance with some embodiments of the inventive concept.
Figure 17B:
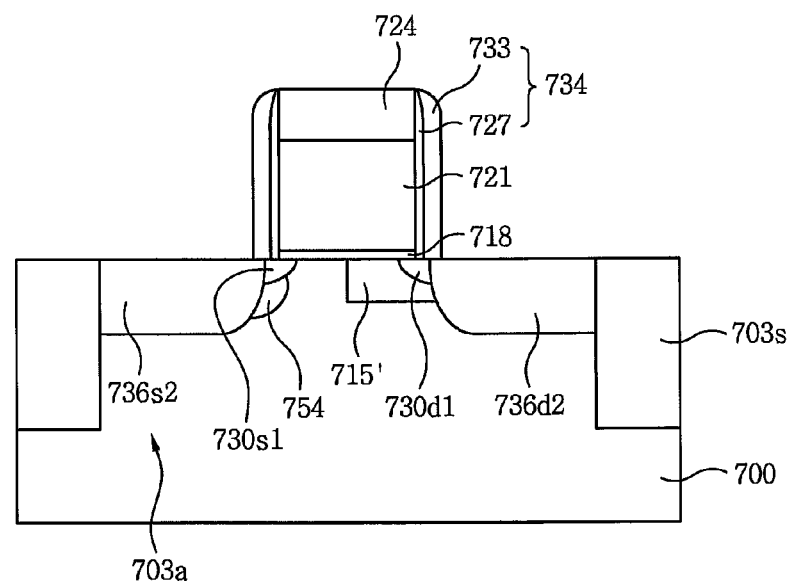

Referring now to FIGS. 17A through 17B, processing steps in the fabrication of semiconductor devices in accordance with some embodiments of the inventive concept will be discussed. As illustrated in FIG. 17A and shown in FIG. 14A, an isolation region 703s defining an active region 703a may be formed in a semiconductor substrate 700. Thereafter, a pad insulating layer 706 may be formed to protect a surface of the active region 703a. The pad insulating layer 706 may include silicon oxide.

A mask 709 may be formed to expose a portion of the active region 703a. Thereafter, a lightly doped channel impurity region 715 may be formed using a channel ion implantation process 712. The channel ion implantation process 712 may include implanting impurity ions of an opposite polarity to impurity ions contained in the active region 503a. For example, when the active region 503a contains P-type impurity ions, such as B, the channel ion implantation process 712 may include implanting N-type impurity ions, such as P or As. Also, when the active region 703a contains N-type impurity ions, such as P or As, the channel ion implantation process 712 may include implanting P-type impurity ions, such as B. Here, the channel ion implantation process 712 may be performed in substantially the same manner as the channel ion implantation process 527a described with reference to FIG. 14B, except for an angle formed by implanted ions with the semiconductor substrate 700. In other words, while the channel ion implantation process 527a described with reference to FIG. 14B is an oblique ion implantation process, the channel ion implantation process 712 may include implanting impurity ions at a right angle to the semiconductor substrate 700.

Referring now to FIG. 17B, the mask 709 and the pad insulating layer 706 may be sequentially removed. Thereafter, a typical MOS transistor forming process may be performed. For instance, a MOS transistor may be formed using the same method as described with reference to FIGS. 14A through 15 except for a channel ion implantation process. Accordingly, a gate dielectric material 718, a gate electrode 721, and a gate mask 724 may be sequentially stacked on the active region 703a, and gate spacers 734 including inner spacers 727 and outer spacers 733 may be formed on sidewalls of the gate dielectric material 718, the gate electrode 721, and the gate mask 724. Also, a source region 730s1 and 736s2 and a drain region 730d1 and 736d2 may be formed in the active region 703a on both sides of the gate electrode 721. Also, a halo region 754 may be formed in the active region 703a adjacent or close to the source region 730s1 and 736s2.

Figure 18A:
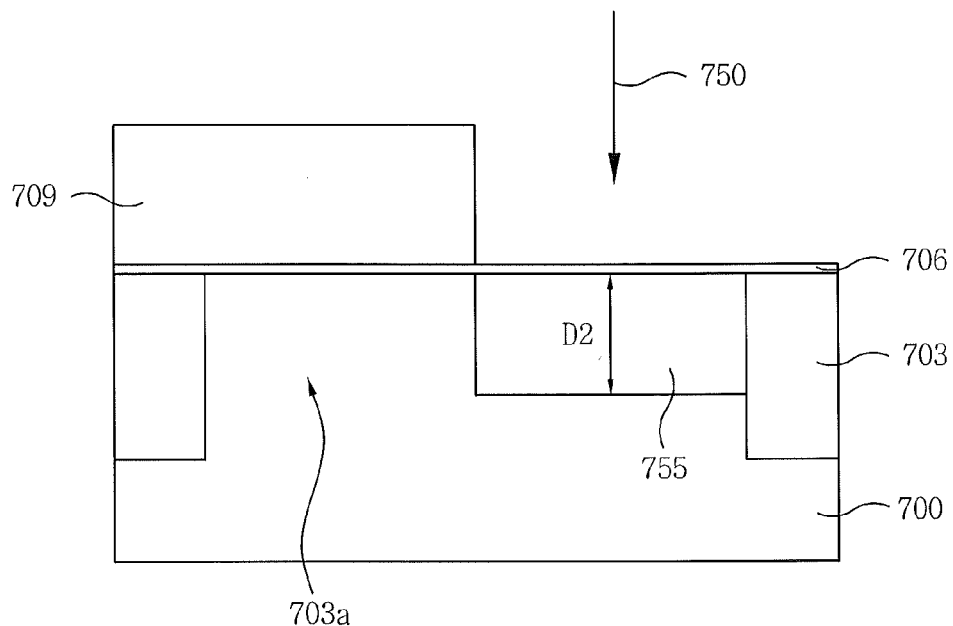
FIGS. 18A and 18B are cross-sections illustrating processing steps in the fabrication of semiconductor devices in accordance with some embodiments of the inventive concept.
Figure 18B:
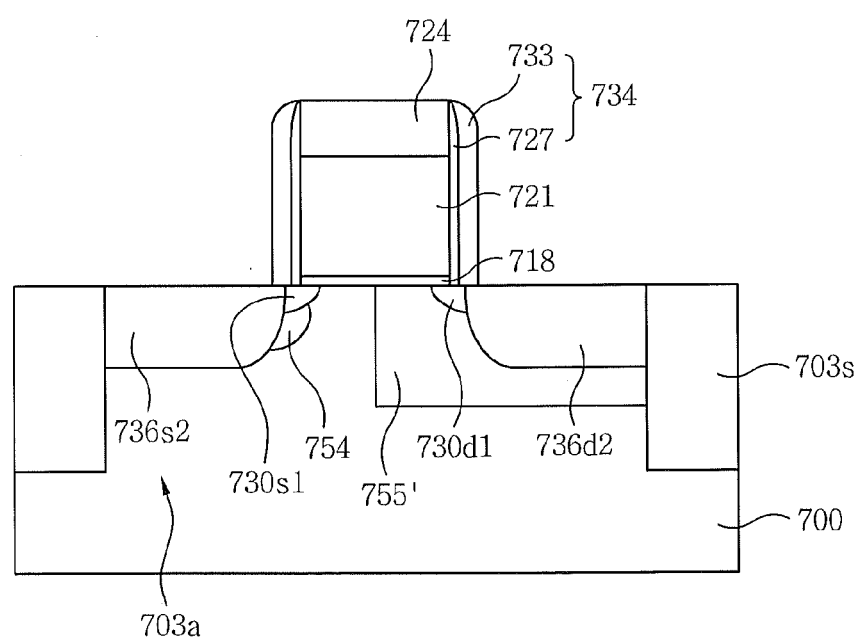

In some embodiments, the process of forming the lightly doped channel impurity region 715 described with reference to FIG. 17A may be modified as shown in FIG. 18A. Referring now to FIG. 18A, a channel ion implantation process 750 may be performed on the semiconductor substrate 700 such that a lightly doped channel impurity region 755 has a greater junction depth D2 than a junction depth D1 of the lightly doped channel impurity region 715. Accordingly, the lightly doped channel impurity region 715' of FIG. 17B may be formed adjacent or close to a lateral surface of the drain region 730d1 and 736d2, while the lightly doped channel impurity region 755 of FIG. 18B may be formed to surround lateral and bottom surfaces of the drain region 730d1 and 730d2.

Figure 19:
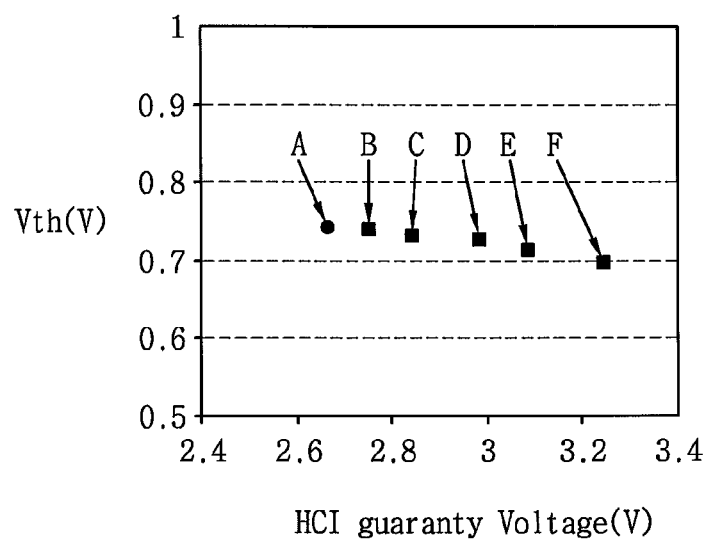
FIG. 19 is a graph illustrating electrical properties of a metal-oxide semiconductor (MOS) transistor in accordance with some embodiments of the inventive concept.

Referring now to FIG. 19, a graph illustrated electrical properties of an NMOS transistor according to some embodiments of the inventive concept will be discussed. In FIG. 19, an ordinate denotes a threshold voltage Vth, and an abscissa denotes HCI characteristics, sample A denotes measurements of a reference NMOS transistor, and the remaining samples B through F denote measurements of NMOS transistors having lightly doped channel impurity regions formed according to embodiments of the inventive concept.

Samples B through F are NMOS transistors having substantially the same structure as the thirteenth MOS transistor T13 of FIG. 7A. Sample A is an NMOS transistor in which the lightly doped channel impurity region 124a is not formed.

In particular, to form the lightly doped channel impurity region 124a, the same channel ion implantation processes 527a and 527b as described with reference to FIG. 14B were performed on the samples B through F. In this case, each of the channel ion implantation processes 527a and 527b required for forming the samples B through F was performed at a dose of about $5E^{12}$ ions/cm$^2$. In this case, as described above, each of the channel ion implantation processes was performed using a Group V element.

Sample B was obtained by performing a channel ion implantation process at an oblique angle of about 20° with an ion energy of about 20 KeV, sample C was obtained by performing a channel ion implantation process at an oblique angle of about 25° with an ion energy of about 30 KeV, sample D was obtained by performing a channel ion implantation process at an oblique angle of about 30° with an ion energy of about 40 KeV, sample E was obtained by performing an ion implantation process at an oblique angle of about 35° with an ion energy of about 50 KeV, and sample F was obtained by performing a channel ion implantation process at an oblique angle of about 40° with an ion energy of about 60 KeV. As a result, it was revealed that samples B through F fabricated according to the embodiments of the inventive concept have better HCI characteristics than sample A. Therefore, MOS transistors according to embodiments of the inventive concept may reduce or possibly prevent performance degradation due to HCI.

Figure 20:
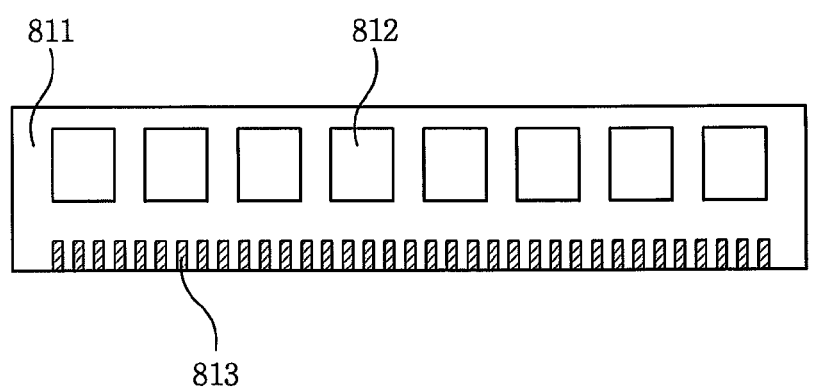
FIGS. 20 through 23 are schematic block diagrams of a semiconductor module, electronic circuit board, data storage device, and electronic system including a semiconductor device in accordance with some embodiments of the inventive concept.

Referring now to FIG. 20, a schematic view of a semiconductor module including a semiconductor device according to some embodiments of the inventive concept will be discussed. Referring to FIG. 20, a semiconductor module 810 in which a semiconductor device including a MOS transistor fabricated according to embodiments of the inventive concept is mounted may include a module substrate 811, a plurality of semiconductor devices 812 disposed on the module substrate 811, and module contact terminals 813 formed in a row at one edge of the module substrate 811 and electrically connected to the semiconductor devices 812. The module substrate 811 may be a printed circuit board (PCB). Both sides of the module substrate 811 may be used. In other words, the semiconductor devices 812 may be disposed on both front and rear surfaces of the module substrate 811. Although FIG. 20 exemplarily illustrates 8 semiconductor devices 812 disposed on the front surface of the module substrate 811, the inventive concept is not limited thereto. Also, the semiconductor module 810 may further include an additional controller or chip set configured to control the semiconductor devices 812 or semiconductor packages. Accordingly, the number of the semiconductor devices 812 shown in FIG. 20 is not necessarily required to constitute one semiconductor module 810. At least one of the semiconductor devices 812 may include any one of MOS transistors according to embodiments of the inventive concept. The module contact terminals 813 may be formed of a metal and have oxidation resistance. The module contact terminals 813 may be variously controlled in order to meet standard requirements of the semiconductor module 810. Therefore, the inventive concept is not specially limited by the number of module contact terminals 813.

Figure 21:
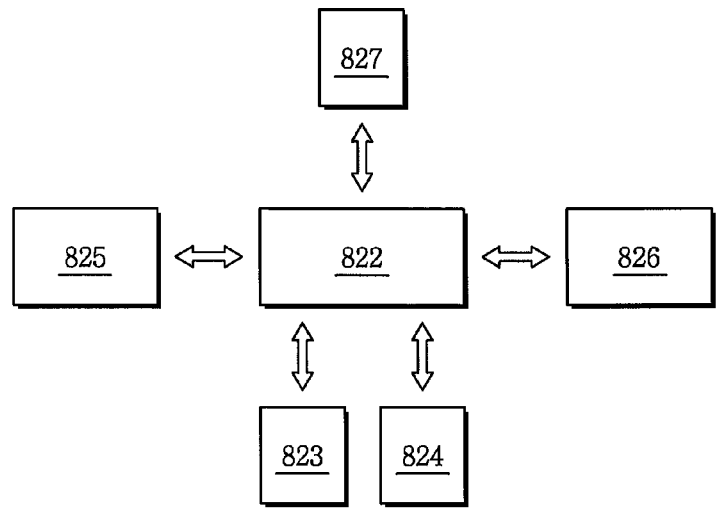

Referring now to FIG. 21, a block diagram of an electronic circuit board including a semiconductor device according to some embodiments of the inventive concept will be discussed. As illustrated in FIG. 21, an electronic circuit board 820 according to embodiments of the inventive concept may include a microprocessor (MP) 822 disposed on a circuit board 821, a main storage circuit 823 configured to communicate with the MP 822, a supplementary storage circuit 824, an input signal processing circuit 825 configured to transmit commands to the MP 822, an output signal processing circuit 826 configured to receive the commands from the MP 822, and a communicating signal processing circuit 827 configured to transmit and receive electric signals to and from other circuit boards. Arrows may denote paths through which electric signals may be transmitted.

The MP 822 may receive and process various electric signals, output processing results, and control other components of the electronic circuit board 820. The MP 822 may be interpreted as, for example, a central processing unit (CPU) and/or a main control unit (MCU). The main storage circuit 823 may temporarily store data always or frequently required by the MP 822, processed data or data to be processed. The main storage circuit 823 may include a semiconductor memory device because the main storage circuit 823 requires a fast response speed. More specifically, the main storage circuit 823 may include a semiconductor memory device called a cache, a static random access memory (SRAM), a dynamic random access memory (DRAM), a resistive random access memory (RRAM), or an applied semiconductor memory device thereof, such as a utilized RAM, a ferroelectric RAM (FRAM), a fast-cycle RAM, a phase-changeable RAM (FRAM), a magnetic RAM (MRAM), and one of other semiconductor memory devices. In addition, the main storage circuit 823 may include a volatile or non-volatile random access memory device.

The supplementary storage circuit 824 may be a mass storage device, which may be a non-volatile semiconductor memory device, such as a flash memory device, or a hard disk drive (HDD) using a magnetic field. Alternatively, the supplementary storage circuit 824 may be a compact disk drive (CDD) using light. The supplementary storage circuit 824 may be used to store a larger amount of data at a lower speed than the main storage circuit 824. The supplementary storage circuit 824 may include a non-volatile memory device. The input signal processing circuit 825 may convert an external command into an electric signal and transmit an externally applied electric signal to the MP 822. The external command or electric signal may be an operation command, an electric signal to be processed, or data to be stored. The input signal processing circuit 825 may be a terminal signal processing circuit configured to process signals transmitted from, for example, a keyboard, a mouse, a touch pad, an image recognition apparatus, or various other sensors, an image signal processing circuit configured to process an input image signal of a scanner or camera, or one of various other sensors or input signal interfaces. The input signal processing circuit 825 may include at least one of semiconductor devices according to the embodiments of the inventive concept and the semiconductor module 810 including the semiconductor devices. The output signal processing circuit 826 may be a component configured to externally transmit an electric signal processed by the MP 822. For example, the output signal processing circuit 826 may be a graphic card, an image processor, an optical converter, a beam panel card, or a multifunctional interface circuit.

The output signal processing circuit 826 may include the semiconductor module 810 including a semiconductor device according to the inventive concept. The communicating signal processing circuit 827 may be a component configured to directly transmit or receive electric signals to or from another electronic system or circuit board without using the input signal processing circuit 825 or the output signal processing circuit 826. For example, the communicating signal processing circuit 827 may be a modem of a personal computer (PC) system, a local area network (LAN) card, or one of various interface circuits. The communicating signal processing circuit 827 may include the semiconductor module 810 including a semiconductor device according to the inventive concept.

Figure 22:
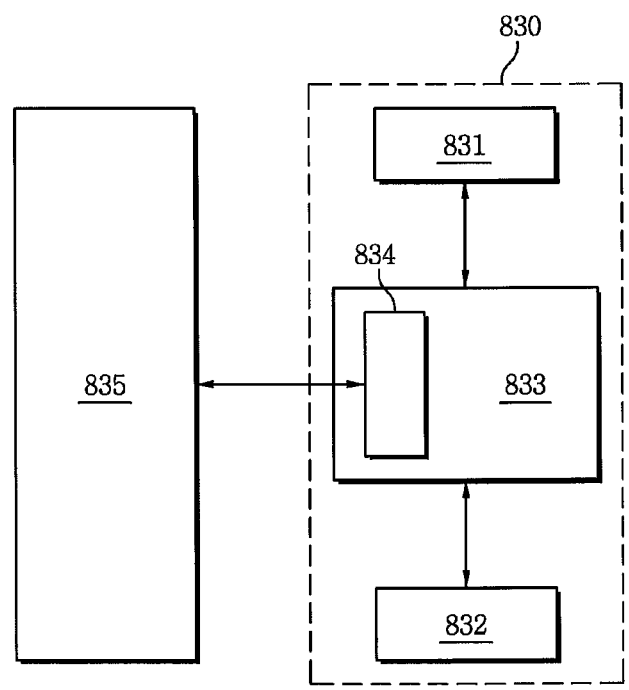

Referring now to FIG. 22, a block diagram of a data storage device including a semiconductor device according to some embodiments of the inventive concept will be discussed. As illustrated in FIG. 22, the data storage device including the semiconductor device according to the embodiments of the inventive concept may include a solid state disk (SSD) 830. The SSD 830 may be an apparatus capable of storing information using a semiconductor device. The SSD 830 may operate at higher speed and reduce mechanical delays, failure rate, generation of heat, and noise compared to a hard disk drive (HDD). Also, the SSD 830 may be downscaled and made lightweight. The SSD 830 may be used for a laptop PC, a desktop PC, an MP3 player, or a portable storage device. The SSD 830 may include a non-volatile memory 831, a buffer memory 832, and a controller 833. Here, the non-volatile memory 831 may include a semiconductor device having a MOS transistor according to the inventive concept.

The non-volatile memory 831 may be a resistive memory. The non-volatile memory 831 may include a data storage element, such as one selected from the group consisting of a phase-change material pattern, a magnetic tunnel junction (MTJ) pattern, a polymer pattern, and an oxide pattern. The buffer memory 832 may include a non-volatile memory. The volatile memory may be a dynamic random access memory (DRAM) or a static random access memory (SRAM). The buffer memory 832 may operate at a higher speed than the non-volatile memory 831. The controller 833 may include an interface 834 connected to a host 835. The interface 834 may be connected to the host 835 and transmit and receive electric signals, such as data. The interface 834 may be an apparatus using one standard selected from the group consisting of serial advanced technology attachment (SATA), integrated drive electronics (IDE), small computer system interface (SCSI), and a combination thereof. Data processing speed of the interface 834 may be higher than operation speed of the non-volatile memory 831. Here, the buffer memory 832 may function to temporarily store data. Data received through the interface 834 may be temporarily stored in the buffer memory 832 through the controller 833 and then semi-permanently stored in the non-volatile memory 831 according to data write speed of the non-volatile memory 831. Also, frequently used data out of data stored in the non-volatile memory 831 may be read beforehand and temporarily stored in the buffer memory 832. In other words, the buffer memory 832 may increase effective operation speed of the SSD 830 and reduce error rate. The controller 833 may include a memory controller (not shown) and a buffer controller (not shown). The non-volatile memory 831 may be disposed adjacent or close to the controller 833 and electrically connected to the controller 833.

The SSD 830 may have data capacity corresponding to the non-volatile memory 831. The buffer memory 832 may be disposed adjacent or close to the controller 833 and electrically connected to the controller 833. The non-volatile memory 831 may be connected to the interface 835 through the controller 833. The non-volatile memory 831 may serve to store data received through the interface 835. Even if power supplied to the SSD 830 is interrupted, the non-volatile memory 831 may retain the stored data. Data processing speed of the interface 835 may be higher than operation speed of the non-volatile memory 831. Here, the buffer memory 832 may serve to temporarily store data. Data received through the interface 835 may be temporarily stored in the buffer memory 832 through the controller 830 and then semi-permanently stored in the non-volatile memory 831 according to data write speed of the non-volatile memory 831. Also, frequently used data out of data stored in the non-volatile memory 831 may be read beforehand and temporarily stored in the buffer memory 832. In other words, the buffer memory 832 may increase effective operation speed of the SSD 830 and reduce error rate.

Figure 23:
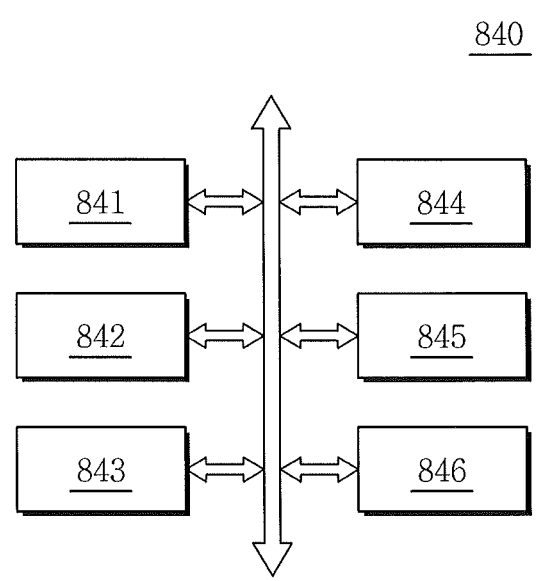

Referring now to FIG. 23, a schematic block diagram of an electronic system including a semiconductor module having a semiconductor device with MOS transistors according to some embodiments of the inventive concept will be discussed. As illustrated in FIG. 23, an electronic system 840 according to embodiments of the inventive concept may include a control unit 841, an input unit 842, an output unit 843, and a storage unit 844 and further include a communication unit 845 and/or another operation unit 846. The control unit 841 may generally control the electronic system 840 and respective components. The control unit 841 may be interpreted as a central processing unit (CPU) or central control unit (CCU) and include the electronic circuit board 820 according to embodiments of the inventive concept. Also, the control unit 841 may include the semiconductor module 810 including the semiconductor device according to the inventive concept. The input unit 842 may transmit an electric command signal to the controller 841. The input unit 842 may be a keyboard, a keypad, a mouse, a touch pad, an image recognizer such as a scanner, or one of various input sensors. The input unit 842 may include the semiconductor module 810 including the semiconductor device according to the inventive concept. The output unit 843 may receive the electric command signal from the controller 841 and output a result processed by the electronic system 840. The output unit 843 may be a monitor, a printer, a beam irradiator, or one of various other mechanical apparatuses. The output unit 843 may include the semiconductor module 810 including the semiconductor device according to the inventive concept.

The storage unit 844 may be a component configured to temporarily or permanently store a signal to be processed or already processed by the control unit 841. The storage unit 844 may be physically and electrically connected or combined with the control unit 841. The storage unit 844 may be a semiconductor memory, a magnetic storage device such as a hard disk, an optical storage device such as a compact disk, or a server having other data storage functions. Also, the storage unit 844 may include the semiconductor module 810 including the semiconductor device according to the inventive concept. The communication unit 845 may receive an electric command signal from the control unit 841 and transmit or receive an electric signal to or from another electronic system. The communication unit 845 may be a wired transceiver apparatus, such as a modem or LAN card, a wireless transceiver apparatus such as a wireless broadband (WiBro) interface, or an infrared (IR) port. Also, the communication unit 845 may include the semiconductor module 810 including the semiconductor device according to the inventive concept. The operation unit 846 may perform physical or mechanical operations in response to commands of the control unit 841. For example, the operation unit 846 may be a component configured to perform mechanical operations, such as a floater, an indicator, or an up/down operator. The electronic system 840 according to the inventive concept may be a computer, a network server, a networking printer or scanner, a wireless controller, a mobile communication terminal, a switching system, or one of other electronic products capable of programmed operations.

According to embodiments of the inventive concept, a transistor including a main channel impurity region defined between a source region and a drain region, and a lightly doped channel impurity region disposed in the active region adjacent or close to the drain region may be provided. The lightly doped channel impurity region disposed adjacent or close to the drain region may have a lower channel impurity concentration than the main channel impurity region. Accordingly, since the occurrence of HCI may be minimized, degradation of the electrical properties of a MOS transistor due to the HCI can be reduced or possibly prevented.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device comprising:
   a gate across an active region of a semiconductor substrate;
   spaced apart source and drain regions in the active region on opposite sides of the gate;
   a main channel impurity region in the active region between the source and drain regions, and having a first channel impurity concentration; and
   a lightly doped channel impurity region in the active region adjacent to the drain region, the lightly doped channel impurity region having a same conductivity type as the main channel impurity region and a second channel impurity concentration that is lower than the first channel impurity concentration,
   wherein both the lightly doped channel impurity region and the main channel impurity region contain a first element including one of Group III and Group V elements of a Mendeleev Periodic Table; and
   wherein the lightly doped channel impurity region further includes a second element, including a different Group element from the first element and the second element including one of the Group III and the Group V elements.

2. The device of claim 1, wherein the lightly doped channel impurity region is spaced apart from the source region.

3. The device of claim 1, wherein the lightly doped channel impurity region is spaced apart from a top surface of the active region.

4. The device of claim 1, wherein the lightly doped channel impurity region is disposed adjacent to the drain region and extends to a top surface of the active region.

5. The device of claim 1, further comprising a halo region in the active region adjacent to the source region, the halo region having a same conductivity type as the main channel impurity region and a third channel impurity concentration that is higher than the first channel impurity concentration.

6. The device of claim 5, wherein the halo region and the lightly doped channel impurity region are spaced apart from each other.

7. The device of claim 1, further comprising:
- a first halo region in the active region adjacent to the source region, the first halo region having a same conductivity type as the main channel impurity region and a third channel impurity concentration that is higher than the first channel impurity concentration; and
- a second halo region in the active region adjacent to the drain region, the second halo region having a same conductivity type as the main channel impurity region and a fourth channel impurity concentration that is higher than the first channel impurity concentration,
- wherein the first and second halo regions are spaced apart from each other, and the second halo region is disposed adjacent to the lightly doped channel impurity region.

8. The device of claim 7, wherein a junction between the lightly doped channel impurity region and the drain region is closer to the gate than a junction between the second halo region and the drain region.

9. The device of claim 1, wherein the drain region includes a first portion configured to form a first PN junction with the lightly doped channel impurity region, and a second portion configured to form a second PN junction with the main channel impurity region.

10. The device of claim 1:
- wherein the main channel impurity region has a first P-type impurity concentration and a first N-type impurity concentration; and
- wherein the lightly doped channel impurity region has the first P-type impurity concentration and a second N-type impurity concentration that is higher than the first N-type impurity concentration.

11. The device of claim 1, wherein the main channel impurity region and the lightly doped channel region have a P-type conductivity, and a Group III atom has a higher concentration than a Group V atom in the lightly doped channel region.

12. The device of claim 1, wherein the drain region has a shallower junction depth than the source region.

13. The device of claim 1, wherein at least one of the source and drain regions includes a heavily doped region and a lightly doped region configured to extend from the heavily doped region into the main channel impurity region disposed under the gate.

14. The device of claim 1, further comprising a gate trench region across the active region between the source and drain regions,
- wherein the gate is provided in the gate trench region, and the lightly doped channel impurity region is provided under the drain region.

15. A semiconductor device comprising:
- a gate electrode across an active region of a semiconductor substrate;
- a gate dielectric material between the gate electrode and the active region;
- spaced apart source and drain regions in the active region on opposite sides of the gate electrode;
- a main channel impurity region in the active region between the source and drain regions; and
- a lightly doped channel impurity region in the active region adjacent to the drain region, the lightly doped channel impurity region having a same conductivity type as the main channel impurity region and a channel impurity concentration that is lower than the main channel impurity region.

16. The device of claim 15, wherein the main channel impurity region has P-type conductivity including boron (B), and the lightly doped channel impurity region has P-type conductivity including B and at least one of phosphorus (P) and arsenic (As).

17. The device of claim 15, wherein each of the main channel impurity region and the lightly doped channel region includes both Group III and Group V elements, and the Group III element has a higher concentration than the Group V element.

18. The device of claim 13, wherein the main channel impurity region has a first width, and the lightly doped channel impurity region has a second width that is less than the first width.

19. A semiconductor device comprising:
- a gate electrode disposed across an active region of a semiconductor substrate;
- a gate dielectric material interposed between the gate electrode and the active region;
- a source region and a drain region disposed in the active region on both sides of the gate electrode and spaced apart from each other;
- a main channel impurity region disposed in the active region between the source and drain regions, and having a first channel impurity concentration;
- a lightly doped channel region disposed in the active region adjacent to the drain region, the lightly doped channel region having a same conductivity type as the main channel impurity region and a second channel impurity concentration that is lower than the first channel impurity concentration; and
- a halo region disposed in the active region adjacent to the source region and having the same conductivity type as the main channel impurity region,
- wherein the main channel impurity region, the lightly doped channel region, and the halo region contain a Group III element have a P-type conductivity,
- the halo region has a higher P-type impurity concentration than the main channel impurity region, and
- the lightly doped channel region contains Group III and V elements and has the P-type conductivity.

20. The device of claim 19, wherein the source region includes a first heavily doped region and a first lightly doped region configured to extend from the first heavily doped region into the main channel impurity region disposed under the gate electrode, and the drain region has a shallower junction depth than the source region.

* * * * *